(12) United States Patent
Tsai et al.

(10) Patent No.: US 10,096,599 B2
(45) Date of Patent: Oct. 9, 2018

(54) METHODS OF INTEGRATING MULTIPLE GATE DIELECTRIC TRANSISTORS ON A TRI-GATE (FINFET) PROCESS

(71) Applicant: Intel Corporation, Santa Clara, CA (US)

(72) Inventors: Curtis Tsai, Beaverton, OR (US); Chia-Hong Jan, Portland, OR (US); Jeng-Ya David Yeh, Portland, OR (US); Joodong Park, Portland, OR (US); Walid M. Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/977,367

(22) Filed: Dec. 21, 2015

(65) Prior Publication Data
US 2016/0111426 A1 Apr. 21, 2016

Related U.S. Application Data

(63) Continuation of application No. 13/997,624, filed as application No. PCT/US2011/067681 on Dec. 28, 2011.

(51) Int. Cl.
| | | |
|---|---|---|
| *H01L 27/092* | (2006.01) | |
| *H01L 29/66* | (2006.01) | |
| *H01L 29/40* | (2006.01) | |
| *H01L 21/8234* | (2006.01) | |
| *H01L 27/088* | (2006.01) | |
| *H01L 29/49* | (2006.01) | |
| *H01L 29/423* | (2006.01) | |
| H01L 29/78 | (2006.01) | |
| H01L 29/51 | (2006.01) | |

(52) U.S. Cl.
CPC .. *H01L 27/0922* (2013.01); *H01L 21/823431* (2013.01); *H01L 21/823456* (2013.01); *H01L 21/823462* (2013.01); *H01L 27/0886* (2013.01); *H01L 27/0924* (2013.01); *H01L 29/401* (2013.01); *H01L 29/408* (2013.01); *H01L 29/42364* (2013.01); *H01L 29/4966* (2013.01); *H01L 29/66484* (2013.01); *H01L 29/66795* (2013.01); *H01L 29/7855* (2013.01); H01L 29/512 (2013.01); H01L 29/513 (2013.01); H01L 29/517 (2013.01); H01L 29/518 (2013.01); H01L 29/7831 (2013.01); H01L 29/7851 (2013.01)

(58) Field of Classification Search
CPC ..... H01L 21/823456; H01L 21/823431; H01L 21/823462; H01L 27/0886; H01L 29/42392; H01L 29/4966; H01L 29/513
See application file for complete search history.

(56) References Cited

U.S. PATENT DOCUMENTS

| | | |
|---|---|---|
| 6,407,435 B1 | 6/2002 | Ma et al. |
| 7,071,048 B2 | 7/2006 | Son et al. |
| 7,361,958 B2 | 4/2008 | Brask et al. |
| 7,550,332 B2 | 6/2009 | Yang |
| 7,902,014 B2 | 3/2011 | Doyle et al. |
| 7,948,037 B2 | 5/2011 | Chen et al. |
| 7,994,037 B2 | 8/2011 | Trentzsch |
| 8,294,212 B2 | 10/2012 | Wang et al. |
| 2005/0093082 A1 | 5/2005 | Son et al. |
| 2007/0080380 A1 | 4/2007 | Chang |
| 2007/0111448 A1 | 5/2007 | Li et al. |
| 2007/0290223 A1 | 12/2007 | Yagishita |
| 2008/0308861 A1 | 12/2008 | Nawaz |
| 2009/0170267 A1 | 7/2009 | Shah et al. |
| 2009/0243941 A1 | 10/2009 | Guthoerl et al. |
| 2009/0294800 A1 | 12/2009 | Cheng et al. |
| 2010/0025770 A1 | 2/2010 | Trentzsch et al. |
| 2010/0065892 A1 | 3/2010 | Hwang et al. |
| 2010/0072553 A1 | 3/2010 | Xu et al. |
| 2010/0276753 A1 | 11/2010 | Greene et al. |
| 2010/0317181 A1 | 12/2010 | Chung et al. |

(Continued)

FOREIGN PATENT DOCUMENTS

| | | |
|---|---|---|
| CN | 102024819 A | 4/2011 |
| CN | 102214579 A | 10/2011 |
| DE | 10 2008 035 808 A | 2/2010 |
| JP | 2006-006438 A | 1/2006 |
| KR | 10-2011-0071198 A | 6/2011 |
| TW | 200412626 A | 7/2004 |
| WO | WO 2010/068530 A2 | 7/2006 |

OTHER PUBLICATIONS

First Office Action (6 pages) from the Chinese State Intellectual Property Office (SIPO) dated May 5, 2016 for Chinese Patent Application No. 201180076461.1 and English Translation thereof (9 pages).

(Continued)

*Primary Examiner* — Brigitte Paterson
(74) *Attorney, Agent, or Firm* — Schwabe, Williamson & Wyatt, P.C.

(57) ABSTRACT

Two or more types of fin-based transistors having different gate structures and formed on a single integrated circuit are described. The gate structures for each type of transistor are distinguished at least by the thickness or composition of the gate dielectric layer(s) or the composition of the work function metal layer(s) in the gate electrode. Methods are also provided for fabricating an integrated circuit having at least two different types of fin-based transistors, where the transistor types are distinguished by the thickness and composition of the gate dielectric layer(s) and/or the thickness and composition of the work function metal in the gate electrode.

6 Claims, 24 Drawing Sheets

(56) References Cited

U.S. PATENT DOCUMENTS

| | | |
|---|---|---|
| 2010/0320545 A1 | 12/2010 | Jagannathan et al. |
| 2011/0034020 A1 | 2/2011 | Johnson |
| 2011/0156166 A1 | 6/2011 | Huang et al. |
| 2011/0159678 A1 | 6/2011 | Hsu et al. |
| 2012/0286372 A1 | 11/2012 | Lavoie et al. |
| 2013/0082332 A1* | 4/2013 | Liu .................. H01L 29/4966 257/369 |
| 2013/0161707 A1 | 6/2013 | Huang et al. |

OTHER PUBLICATIONS

International Search Report dated Jul. 18, 2012 for PCT/US2011/067681, filed Dec. 28, 2011, 3 pages.

First Office Action from the Taiwan IPO for Taiwan Patent Application No. 101149334 dated May 27, 2015 and English Summary thereof.

Official Letter and Search Report (7 pages) dated Nov. 16, 2016 from the Taiwan Intellectual Property Office for Taiwan Patent Application No. 101149334 and English Summary (4 pages) thereof.

Official Letter and Search Report (9 pages) dated Nov. 17, 2016 from the Taiwan Intellectual Property Office for Taiwan Patent Application No. 105101077 and English Summary (4 pages) thereof.

Office Action (9 pages) from the German Patent and Trademark Office dated Dec. 14, 2016 for German Patent Application No. 112011106052.1 and English Translation (9 pages) thereof.

Second Office Action (7 pages) dated Jan. 20, 2017 from the State Intellectual Property Office (SIPO) for Chinese Patent Application No. 201180076461.1 and English Translation (9 pages) thereof.

Taiwan Official Letter for Taiwan Application No. 105101077, dated Apr. 25, 2017, (no translation), 15 pages.

Taiwan IPO Notice of Allowance for Taiwan Application No. 101149334, dated Apr. 25, 2017, with translation, 3 pages.

Office Action from Taiwan Patent Application No. 106124016, dated Dec. 5, 2017, 14 pages.

English Summary of Office Action from Taiwan Patent Application No. 106124016, 2 pages.

Office Action from Chinese Patent Application No. 201610006987.7, dated Feb. 2, 2018, 5 pages.

Office Action from U.S. Appl. No. 13/997,624, dated Nov. 9, 2017, 12 pages.

Office Action from Taiwan Patent Application No. 106124016, dated Apr. 11, 2018, 9 pages.

Office Action from U.S. Appl. No. 13/997,624 dated Jul. 11, 2018, 16 pages.

* cited by examiner

METHODS OF INTEGRATING MULTIPLE GATE DIELECTRIC TRANSISTORS ON A TRI-GATE (FINFET) PROCESS

This is a Continuation application of Ser. No. 13/997,624 filed Jun. 24, 2013, which is a U.S. National Phase application under 35 U.S.C. § 371 of International Application No. PCT/US2011/067681 filed Dec. 28, 2011.

TECHNICAL FIELD

The present invention relates generally to the manufacture of semiconductor devices, semiconductor logic devices, and transistors. In particular, embodiments of the present invention relate to processes for fabricating a multiple fin-based devices with varied gate structures on the same chip.

BACKGROUND

The desire for ever-smaller integrated circuits (IC) places enormous demands on the techniques and materials used to construct the devices. Components of IC chips include solid-state logic devices (transistors) such as CMOS (complementary metal oxide semiconductor) devices. Recently developed fin-based transistors enable increased performance for a smaller device footprint. Different transistor applications have different structure and performance requirements, for example, high speed logic operations, low power usage, high voltage input output (I/O), and extremely high voltage. Novel processes are required to enable fabrication of multiple types of new fin-based transistors on a single chip.

DETAILED DESCRIPTION

An integrated circuit (IC) structure comprising two or more fin-based field effect transistors, having different types of gate structures, and a method for forming the different types of transistors on a single chip are described. The present invention has been described with respect to specific details in order to provide a thorough understanding of the invention. One of ordinary skill in the art will appreciate that the invention can be practiced without these specific details. In other instances, well known semiconductor processes and equipment have not been described in specific detail in order to not unnecessarily obscure the present invention. Additionally, the various embodiments shown in the figures are illustrative representations and are not necessarily drawn to scale.

Embodiments of the present invention provide an integrated circuit housing a plurality of fin-based transistors having different types of gate structures, and methods for manufacturing these different types of devices on a single circuit. The formation of ICs having a plurality of transistor types can address divergent circuit requirements, such as, for example, high speed logic operation, low power usage, high voltage input output (I/O), and extremely high voltage, which are desirable attributes for components of system-on-a-chip (SOC) integrated circuits. System-on-a-chip devices integrate a wide variety of circuit functions, such as processor cores, analog functions, and mixed signal blocks, onto a single integrated circuit chip. Embodiments of the invention provide ICs with transistors having different types of gate structures, each comprising one or two high k material gate dielectric layers, an oxide ($SiO_2$) layer, one or two work-function metal layers, a fill metal, and combinations thereof. Transistors with different gate structures are capable of providing performance characteristics that span a wide range of operating speeds, leakage characteristics, and high voltage tolerances. Methods of forming circuits comprising transistors with different gate structures are also disclosed.

FIGS. 1A-1D illustrate embodiments of fin-based transistors located in an integrated circuit. Each integrated circuit has at least two different transistor types that are distinguished at least by the thickness or composition of the gate dielectric and/or the composition of the work function metal(s) employed in the gate electrode. The transistors may have other distinguishing features. Typically, an integrated circuit having a plurality of different transistor types will have a large number of instances of each type of transistor arranged in various formats (e.g., arrays). For simplicity, one instance of each type of transistor is shown in FIGS. 1A-1D as an isolated transistor, although the transistors illustrated are typically found in various places and arrangements in the integrated circuit chip in which they are located.

Figure 1A:
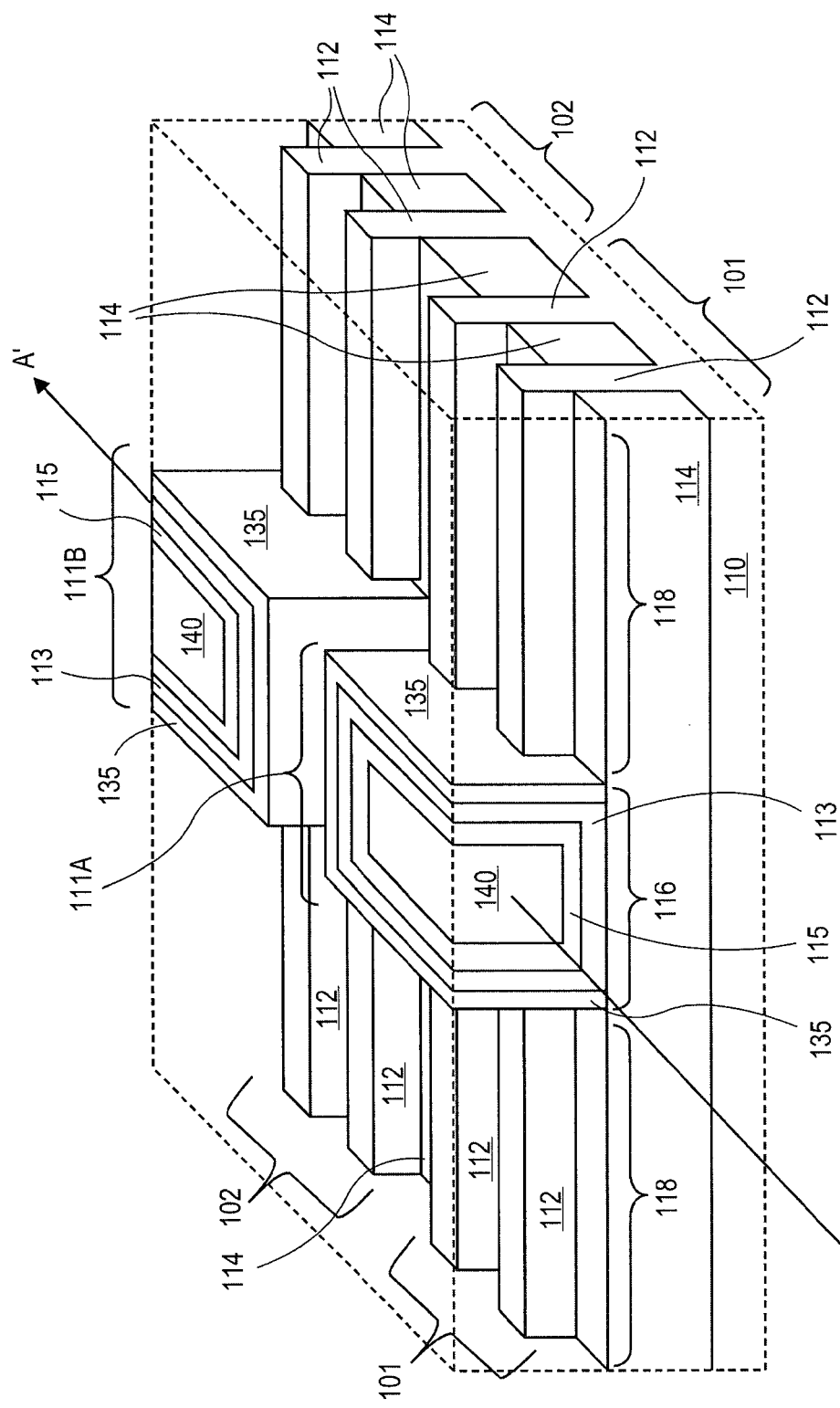
FIGS. 1A-1D illustrate embodiments of dual-gate transistors, wherein each transistor has a different gate stack configuration.
Figure 1B:
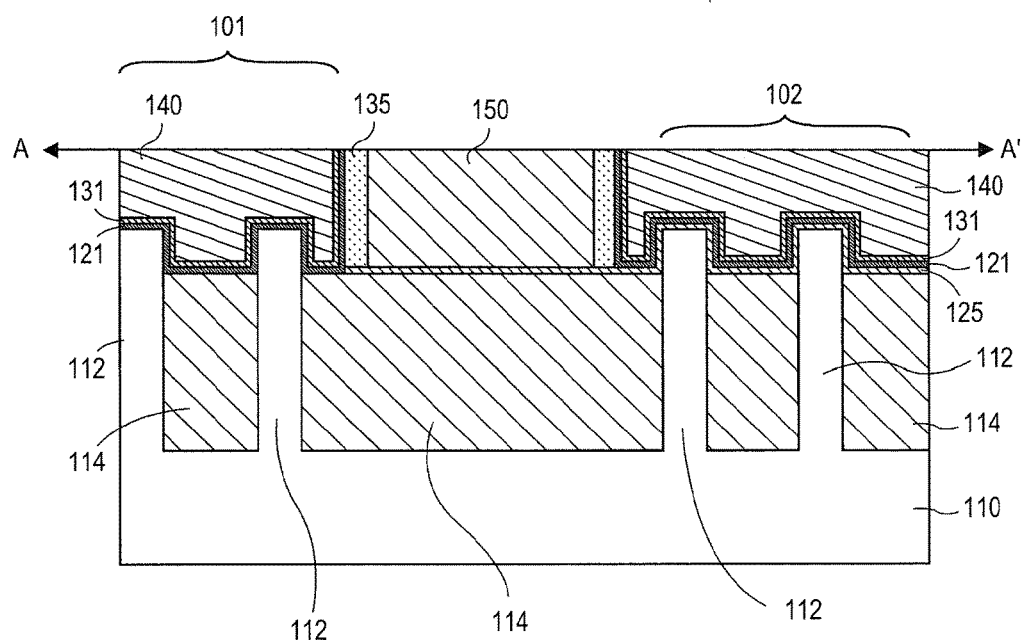

FIG. 1A illustrates a three-dimensional perspective view of two transistors 101 and 102 formed on the same IC. FIG. 1B illustrates a cross-sectional view of transistors 101 and 102 as shown in FIG. 1A, taken through the channel regions 116 and gate structures 111A and 111B along line A-A'. Fins 112 extend from semiconductor substrate 110 and, in embodiments, run the full length of substrate 110. In an embodiment, each transistor comprises one or more fins 112 separated by isolation regions 114. In an embodiment, each transistor comprises a gate structure 111 that wraps around the side and top surfaces of a portion of each fin 112, defining a channel region 116. In an embodiment, transistor 101 comprises gate structure 111A, and transistor 102 comprises gate structure 101B, as shown in FIG. 1A. Each fin 112 has a pair of source/drain regions 118 disposed on opposite sides of channel region 116, as shown in the embodiment illustrated by FIG. 1A. For a PMOS device, the source/drain regions are p-type doped and the channel region is n-type doped. For an NMOS device, the source/drain regions are n-type doped and the channel region is p-type doped. The height of fins 112 above isolation regions 114 ranges from 20 to 100 Å, and the width of fins 112 range from 5 to 20 Å.

Each transistor gate structure 111A and 111B comprises a gate dielectric 113 and a gate electrode 115, as shown in FIG. 1A. Each gate dielectric 113 may comprise one or more dielectric layers, for example, a silicon dioxide layer or a high k dielectric layer. The gate dielectric 113 insulates the channel region 116 from the gate electrode 115 to reduce leakage and to set the device threshold voltage. Each gate electrode 115 includes one or more work-function metal layers and may also include a conductive fill metal 140. A work function metal layer manages the barrier height between the dielectric material and the fill metal, minimizing resistance at the metal-semiconductor interface, and setting the work function of the device. The fill metal carries the bulk of the charge that controls the transistor state, and typically is a lower-resistance material than the work function metal(s).

The integrated circuit shown in FIGS. 1A-D has at least two different types of transistors, 101 and 102 that are distinguished by the composition of the dielectric layers employed in the transistor gate structure. In an embodiment of the invention, the gate structure of transistor 101 comprises a gate dielectric having a high k dielectric layer 121 and a gate electrode having both a work function metal layer 131 and a fill metal 140, as shown in FIG. 1B. The type of gate structure in transistor 101 enables use of the transistor for high performance cores.

In an embodiment of the invention, high k dielectric layer 121 conforms to the side and top surfaces of the fins 112 and isolation regions 114 that comprise transistor 101. In general, a high k dielectric layer is a dielectric material having a dielectric constant greater than that of silicon dioxide. The dielectric constant of silicon dioxide is 3.9. Exemplary high k dielectric materials that may be used in high-k dielectric layer 121 include hafnium dioxide ($HfO_2$), hafnium silicon oxide, lanthanum oxide, lanthanum aluminum oxide, zirconium dioxide ($ZrO_2$), zirconium silicon oxide, titanium dioxide ($TiO_2$), tantalum oxide, barium strontium titanium oxide, barium titanium oxide, strontium titanium oxide, yttrium oxide, aluminum oxide, lead scandium tantalum oxide, lead zinc niobate, and other materials known in the semiconductor art. High k dielectric layer 121 ranges from 10 to 50 Å thick. In an embodiment, high k dielectric layer is 30 Å thick.

Work function metal layer 131 conforms to the surface of high k dielectric layer 121. Exemplary metals that may be used in work function metal layer 131 include titanium nitride, tungsten nitride, tantalum nitride, titanium aluminum, tungsten, silicides and other materials known in the semiconductor art. Work function metal layer 131 ranges from 10 to 50 Å thick. In an embodiment, work function metal layer 131 is 30 Å thick.

Fill metal 140 fills the gate structure opening defined by work function metal layer 131. Fill metal 140 may comprise materials including, for example, metal gate materials, such as, hafnium, zirconium, titanium, titanium nitride, tantalum, aluminum, and combinations thereof. Additional materials include, metal carbides, such as, for example, titanium carbide, zirconium carbide, tantalum carbide, hafnium carbide and aluminum carbide. Further materials that may be used include ruthenium, palladium, platinum, cobalt, nickel, and conductive metal oxides, such as, for example, ruthenium oxide. Other materials are possible.

In an embodiment, the gate structure of transistor 102 has a gate dielectric comprising both a silicon dioxide layer 125 and high k dielectric layer 121, and a gate electrode comprising both work function metal layer 131 and fill metal 140. In an embodiment, silicon dioxide layer 125 is grown from the surfaces of fins 112. In another embodiment, silicon dioxide layer 125 is conformally deposited on fins 112 and isolation region 114. Silicon dioxide layer 125 may be from 5 to 100 Å thick. In an embodiment, silicon dioxide layer 125 is 30 Å thick. In an embodiment, high k dielectric layer 121 covers silicon dioxide layer 125 within the gate structure, and together the two layers form the gate dielectric. In an embodiment, work function metal 131 covers high k dielectric layer 121, and fill metal 140 fills the opening lined by work function metal 131. As compared to the gate structure in transistor 101, the addition of silicon dioxide layer 125 to the gate dielectric enables use of transistor 102 for high voltage, input output (I/O) circuit applications.

Typically, transistor structures 101 and 102 are at least partially surrounded by a dielectric material 150, as shown in FIG. 1B. In some embodiments dielectric material 150 is an interlayer dielectric (ILD) material, such as silicon dioxide or low k dielectric materials. Additional dielectric materials that may be used include carbon doped oxide (CDO), silicon carbide, silicon nitride, organic polymers such as perfluorocyclobutane or polytetrafluoroethylene, fluorosilicate glass (FSG), and organosilicates such as silsesquioxane, siloxane, or organosilicate glass.

In an embodiment, spacers 135 are located on sidewalls of the gate structure 111. Spacers 135 are formed on the gate structure 111 sidewalls adjacent to the source/drain regions 118, as shown in FIG. 1A, in order to isolate the gate structure 111 from epitaxial material grown on fins 112, and also to protect the channel region 116 during heavy doping of the source/drain regions. Spacers 135 may additionally be formed on the ends of each gate structure 111, as shown in FIG. 1B. Spacers 135 may be comprised of a suitable dielectric material, such as, for example, silicon nitride, silicon dioxide, silicon oxynitride, or other material known in the semiconductor art.

Figure 1C:
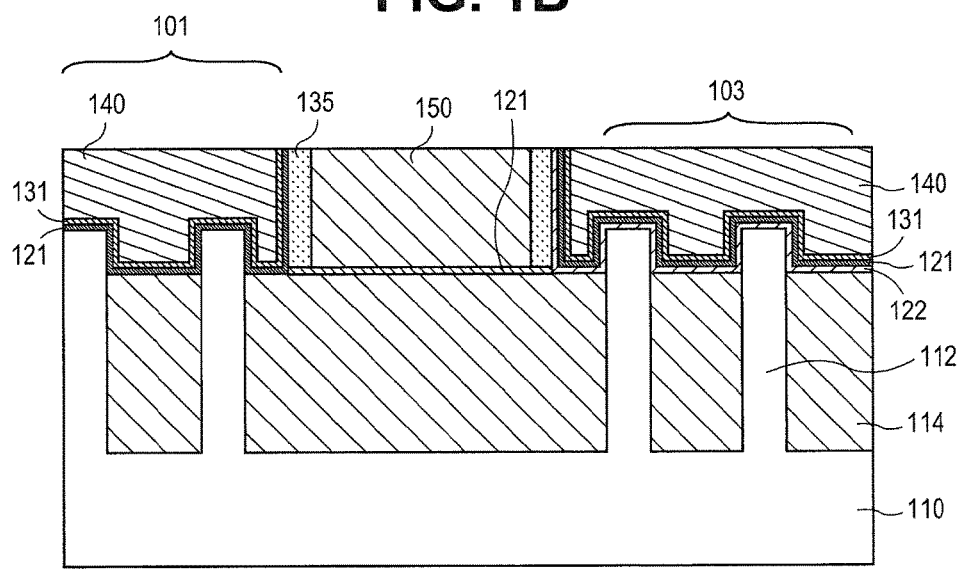

Another embodiment of the invention comprises at least two different types of fin-based transistors, 101 and 103, where each transistor is distinguished by the composition of the dielectric layers employed in the gate structures, as shown in FIG. 1C. In an embodiment of the invention, the gate structure of transistor 101 comprises a gate dielectric having a high k dielectric layer 121 and a gate electrode having both a work function metal layer 131 and a fill metal 140.

The gate structure of transistor 103 comprises a gate dielectric having both a high k dielectric layer 122 and high k dielectric layer 121, and a gate electrode having both work function metal layer 131 and fill metal 140. In an embodiment, high k dielectric layer 122 is formed on the fin surface. In an embodiment, high k dielectric layer 121 covers high k dielectric layer 122. In an embodiment, work function metal layer 131 covers high k dielectric layer 121. In an embodiment, fill metal 140 completes the gate structure by filling in the gate structure opening defined by work function metal layer 131. In an embodiment, high k dielectric layer 122 has a different composition or thickness than high k dielectric layer 121. As compared to the gate structure in transistor 101, the addition of high k dielectric material 122 reduces gate leakage while increasing the threshold voltage, enabling use of transistor 103 for low-power circuits or applications. High k dielectric layer 122 may be any of the materials listed above with respect to high k dielectric layer 121. High k dielectric layer 122 ranges from 10 to 50 Å thick. In an embodiment, high k dielectric layer 122 is 30 Å thick.

Figure 1D:
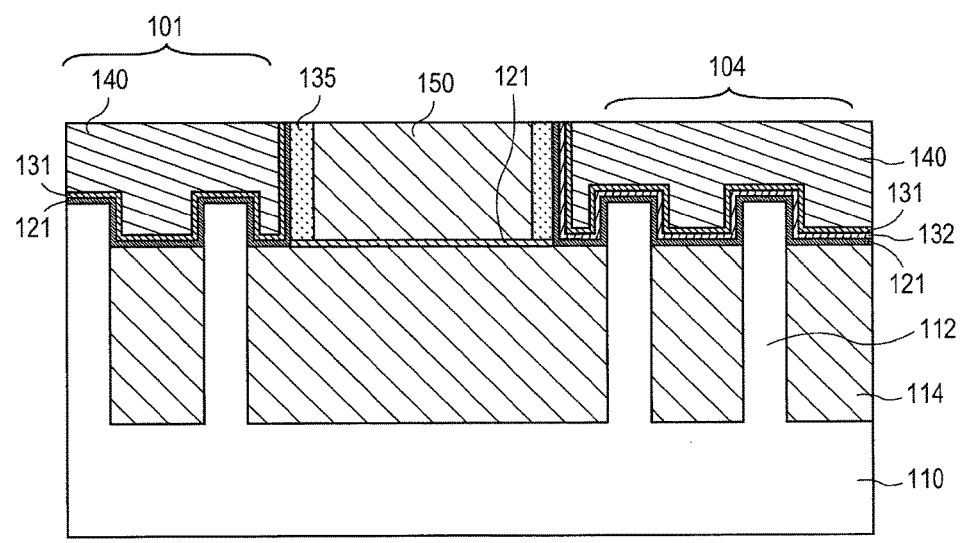

Another embodiment of the invention comprises at least two different types of fin-based transistors, 101 and 104, located on a single integrated circuit, where each type of transistor has a different gate structure, as illustrated by FIG. 1D. In an embodiment of the invention, transistors 101 and 104 are distinguished by the composition of the work-function metal(s) employed in each gate electrode. In a specific embodiment, the gate structure of transistor 101 comprises a gate dielectric having a high k dielectric layer 121 and a gate electrode having both a work function metal layer 131 and a fill metal 140.

In an embodiment, the gate structure in transistor 104 comprises a gate dielectric having high k dielectric layer 121 and a gate electrode having a work function metal layer 132, work function metal layer 131 and fill metal 140. In an embodiment, high k dielectric layer 121 covers the fins 112. In an embodiment, work function metal layer 132 covers high k dielectric layer 121. In an embodiment, work function metal layer 131 covers work function metal layer 132. In an embodiment, fill metal 140 fills the gate structure opening defined by work function metal layer 131. In an embodiment, work function metal layer 132 in transistor 104 has a different work function than work function metal layer 131. The addition of work function metal 132, as compared to the gate structure in transistor 101, increases the threshold voltage for transistor 104 and reduces gate leakage, enabling use of transistor 104 for low-power circuits or applications. Work function metal layer 132 may be any of the materials listed above with respect to work function metal layer 131. Work function metal layer 132 may be from 10 to 50 Å thick. In an embodiment, work function metal layer 132 is 30 Å thick.

Figure 2A:
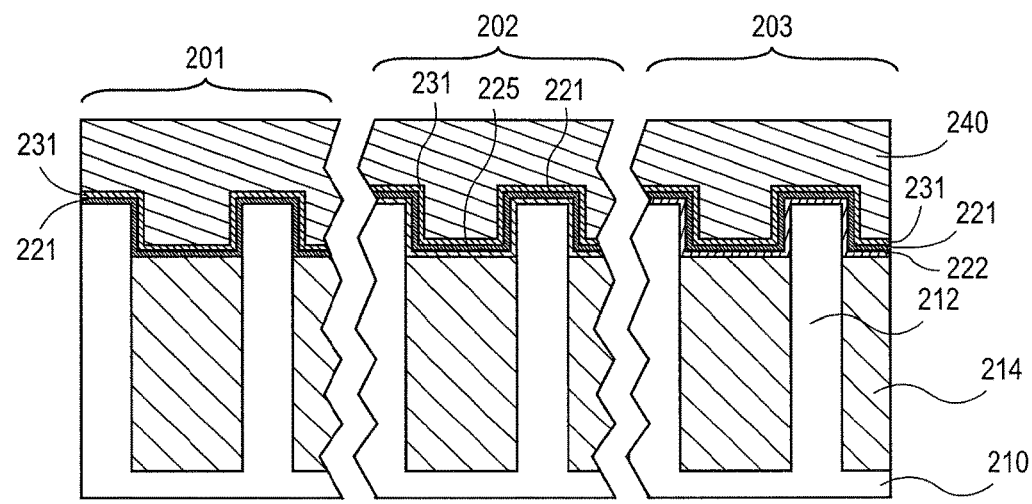
FIGS. 2A-2B illustrate embodiments of triple-gate transistors, wherein each transistor has a different gate stack configuration.
Figure 2B:
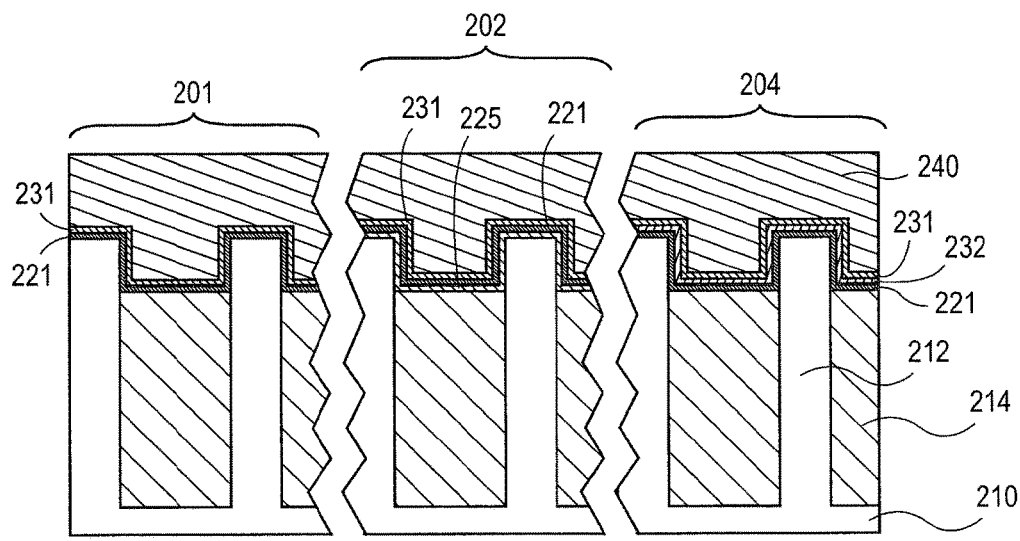

The embodiments illustrated by FIGS. 2A-B comprise three or more types of fin-based transistors on a single integrated circuit, where each type of transistor has a different gate structure. Typically, an integrated circuit having a plurality of different types of transistors will have a large number of instances of each type of transistor arranged in various formats (e.g., arrays). For simplicity, one instance of each type of transistor is shown in the figures as an isolated transistor, although the illustrated transistors are typically found in various places and arrangements on the integrated circuit chip in which they are located.

The integrated circuit shown in FIG. 2A has at least three different types of transistors, 201, 202, and 203 that are distinguished by the thickness or composition of the dielectric layers employed in the gate structure, according to an embodiment of the invention. In an embodiment, the gate structure in transistor 201 comprises a gate dielectric having high k dielectric layer 221 and a gate electrode having both a work function metal layer 231 and a fill metal 240. Transistor 201 may be used for high performance processor cores. In an embodiment, the gate structure in transistor 202 comprises a gate dielectric having both a silicon dioxide layer 225 on the fin surface and high k dielectric layer 221 over silicon dioxide layer 225. In an embodiment, transistor 202 further comprises a gate electrode having work function metal layer 231 and fill metal 240. The addition of silicon dioxide layer 225 reduces leakage and increases the threshold voltage, as compared to transistor 201, enabling use of transistor 202 for high-voltage input output (I/O) circuits or applications. In an embodiment, the gate structure of transistor 203 comprises a gate dielectric having both a high k dielectric layer 222 on fins 212 and high k dielectric layer 221 over high k layer 222. In an embodiment, transistor 202 further comprises a gate electrode having both work function metal layer 231 and fill metal 240. In an embodiment, high k dielectric layer 222 has a different composition than high k dielectric layer 221. In another embodiment, high k dielectric layer 222 has a different thickness than high k dielectric layer 221. The addition of high k dielectric layer 222 to the gate structure reduces leakage, as compared to transistor 201, enabling use of transistor 203 for low-power circuits.

The integrated circuit illustrated in FIG. 2B has at least three different types of transistors, 201, 202 and 204, that are distinguished by the composition or thickness of the dielectric layers and/or the composition of the work-function metals employed in the transistor gate structure. In an embodiment, the gate structure in transistor 201 comprises a gate dielectric having high k dielectric layer 221 and a gate electrode having both a work function metal layer 231 and a fill metal 240. Transistor 201 is designed to be used for high performance processor cores. In an embodiment, the gate structure in transistor 202 comprises a gate dielectric having both a silicon dioxide layer 225 on fins 212 and high k dielectric layer 221 on silicon dioxide layer 225. In an embodiment, transistor 202 further comprises both a gate electrode having work function metal layer 231 and fill metal 240. The addition of silicon dioxide layer 225 reduces leakage and increases the threshold voltage, as compared to transistor 201, enabling use of transistor 202 for high-voltage input output (I/O) circuits or applications. In an embodiment, the gate structure of transistor 204 comprises a gate dielectric having high k dielectric layer 221 and a gate electrode having a work function metal layer 232, work function metal layer 231 on work function metal layer 232, and fill metal 240. In an embodiment, work function metal 232 has a different work function than work function metal layer 231. The addition of work function metal layer 232 reduces leakage, as compared to transistor 201, enabling use of transistor 204 for low power circuits or applications.

Figure 3A:
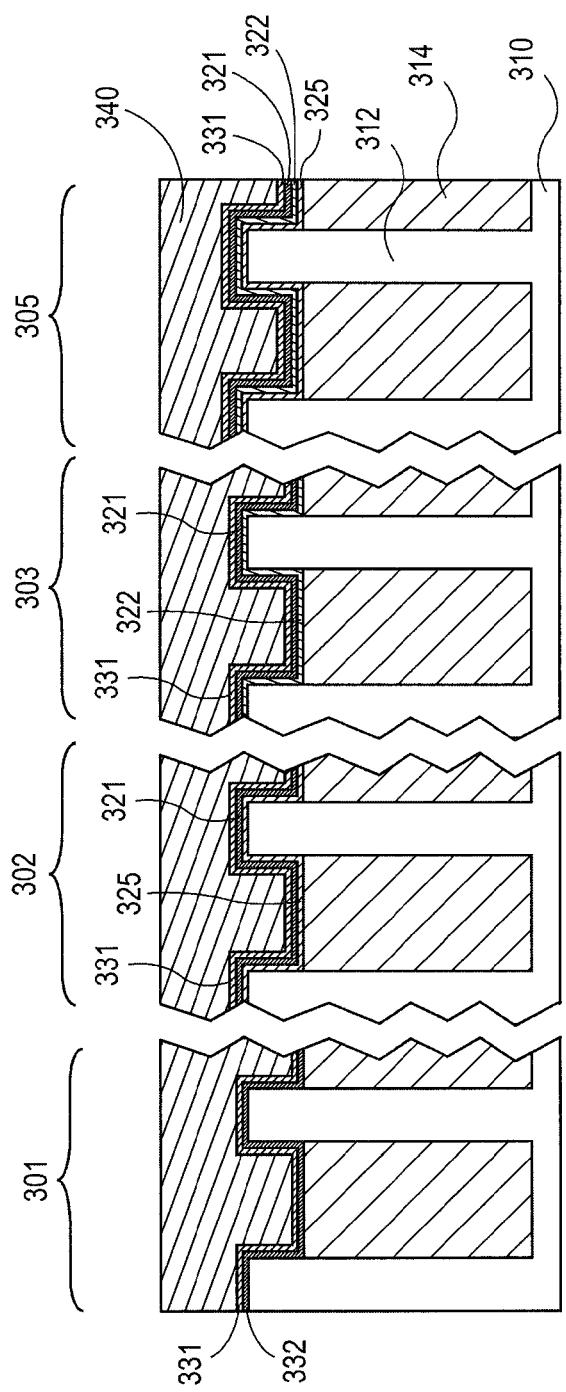
FIGS. 3A-3B illustrate embodiments of quad-gate transistors, wherein each transistor has a different gate stack configuration.
Figure 3B:
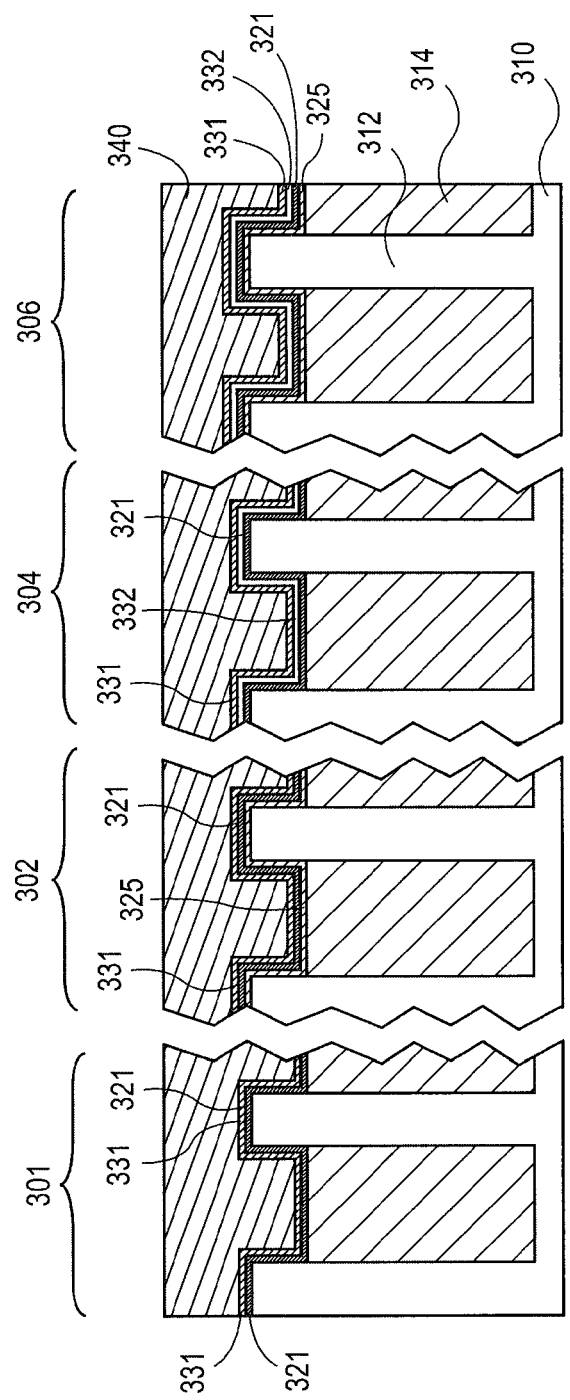

Circuits comprising at least four types of fin-based transistors, where each type of transistor has a different gate structure, are illustrated in FIGS. 3A-C, according to embodiments of the invention. The embodiments comprising four types of transistor gate structures, as illustrated in FIGS. 3A-B, are extensions of the three-type transistor embodiments illustrated in FIGS. 2A-B, and may be fabricated without incurring additional processing steps.

The integrated circuit shown in FIG. 3A has at least four different types of transistors, 301, 302, 303 and 305 that are distinguished by the thickness or composition of the dielectric layers employed in the gate structure. In an embodiment, the gate structure in transistor 301 comprises a gate dielectric having a high k dielectric layer 321, and a gate electrode having both a work function metal layer 331 and a fill metal 340. Transistor 301 is designed to be used for high performance processor cores. In an embodiment, the gate structure in transistor 302 comprises a gate dielectric having both a silicon dioxide layer 325 grown on fins 312 and high k dielectric layer 321 over the silicon dioxide layer 325. In an embodiment, transistor 302 further comprises a gate electrode having both work function metal layer 331 and fill metal 340. Transistor 302 is designed to be used for high-voltage input output (I/O) circuits. In an embodiment, the gate structure in transistor 303 comprises a gate dielectric having both a high k dielectric layer 322 on the fin surface and high k dielectric layer 321 over high k dielectric layer 322, and a gate electrode having both work function metal layer 331 and fill metal 340. In an embodiment, the composition of high k dielectric layer 322 is different than that of high k dielectric layer 321. In another embodiment, the thickness of high k dielectric layer 322 is different than that of high k dielectric layer 321. Transistor 303 is designed to be used for low-power circuits.

In an embodiment, the gate structure of transistor 305 comprises a gate dielectric having silicon dioxide layer 325 on the fins, high k dielectric layer 322 over silicon dioxide layer 325, and high k dielectric layer 321 over high k dielectric layer 322. In an embodiment, high k dielectric layer 322 has a different composition than that of high k dielectric layer 321. In another embodiment, high k dielectric layer 322 has a different thickness than that of high k dielectric layer 321. In an embodiment, transistor 305 further comprises a gate electrode having work function metal layer 331 and fill metal 340. As compared to the high-performance gate structure in transistor 301, the additions of silicon dioxide layer 325 and high k dielectric layer 322 increase the threshold voltage of transistor 305, such that transistor 305 may be used for circuits requiring extremely high voltages.

Another embodiment of a circuit having multiple types of transistors is illustrated by FIG. 3B. The integrated circuit has at least four types different transistors, 301, 302, 304 and 306, that are distinguished at least by the thickness or composition of the dielectric layers and/or the composition of the work function metals employed in the gate structure. In an embodiment, the gate structure in transistor 301 comprises a gate dielectric having a high k dielectric layer 321 and a gate electrode having both a work function metal layer 331 and a fill metal 340. Transistor 301 is designed to be used for high performance processor cores. In an embodiment, the gate structure in transistor 302 comprises a gate electrode having both a silicon dioxide layer 325 grown on fins 312 and high k dielectric layer 321 over silicon dioxide layer 325. In an embodiment, transistor 302 further comprises a gate electrode having both work function metal layer 331 and fill metal 340. Transistor 302 is designed to be used for high-voltage input output (I/O) circuits. In an embodiment, the gate structure in transistor 304 comprises gate dielectric having a high k dielectric layer 321 and a gate electrode having a work function metal layer 332 layer, work function metal 331 layer over the work function metal layer 332 layer, and fill metal 340. In an embodiment, work function metal layer 332 has a different work function than work function metal 331. Transistor 304 is designed to be used for low-power circuits.

In an embodiment, the gate structure in transistor 306 comprises a gate dielectric having both silicon dioxide layer 325 grown on fins 312 and high k dielectric layer 321 over silicon dioxide layer 325. In an embodiment, transistor 306 further comprises a gate electrode having work function metal layer 332, work function metal layer 331 over work function metal layer 332, and fill metal 340. In an embodiment, work function metal layer 332 has a different work function than work function metal layer 331. As compared to the high-performance gate structure in transistor 301, the additions of silicon dioxide layer 325 and work function metal layer 332 increase the threshold voltage of transistor 306, such that transistor 306 may be used for circuits requiring extremely high voltages.

With respect to the previously described embodiments, it should be noted that it is also possible to vary other device characteristics such as the width of the gate, the width of the channel region, and the types of sources and drains used to achieve specific transistor properties, as is understood by those of skill in the art.

In manufactured devices, layers of materials can deviate in appearance from the simplified illustrations provided herein for clarity, and can be, for example, slightly thicker or thinner in areas. Additionally, what is described here as a "layer" of material may be made up of a plurality of layers of the material that essentially function as one layer.

FIGS. 4A-I describe an embodiment of a method for the formation of multiple types of fin-based transistor gate structures. The method is useful for forming integrated circuits comprising different types of fin-based transistors on the same chip, wherein the transistors have at least two different gate dielectric structures. An integrated circuit chip typically comprises multiple copies of the same transistor in various locations on the substrate, however, one of each type of transistor is shown in FIGS. 4A-I for clarity.

Figure 4A:
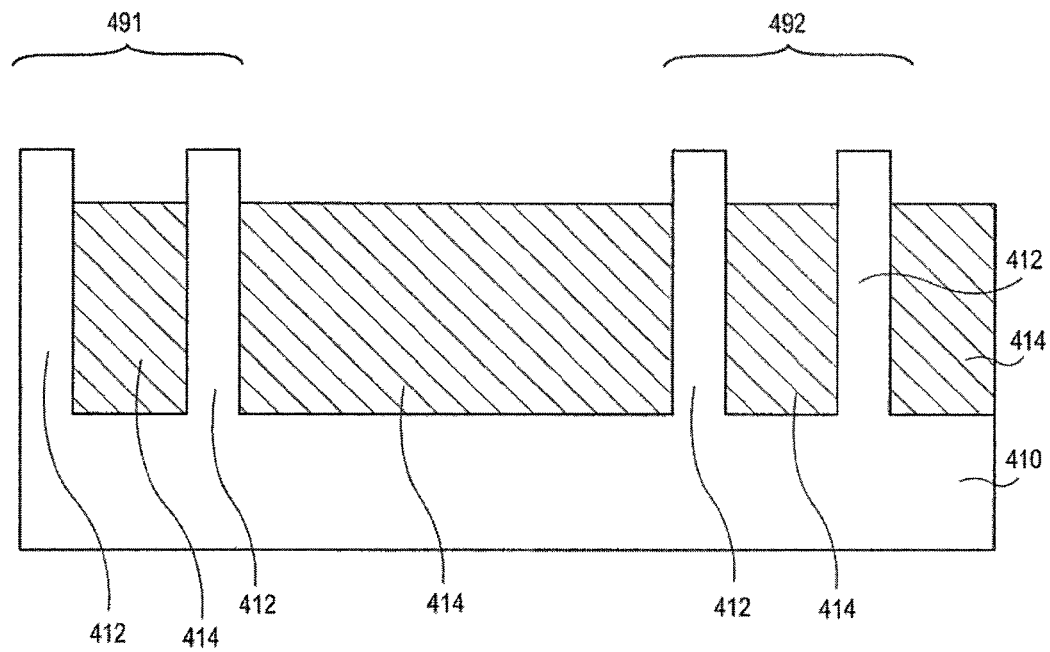
FIGS. 4A-4I illustrate methods for forming a single IC having multiple transistors with different gate stack configurations.
Figure 4B:
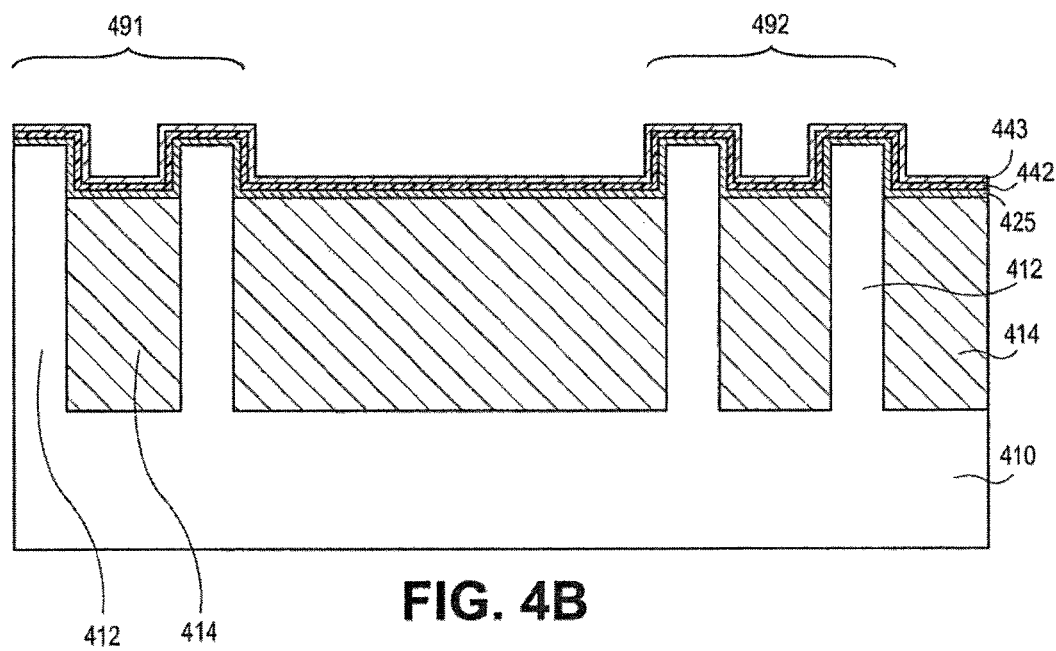

A substrate 410 having fins 412 is provided. In an embodiment of the invention, fins 412 are formed from a bulk monocrystalline substrate. Substrate 410 and fins 412 can be formed of any well known semiconductor material, such as but not limited to silicon, germanium, silicon germanium, and III-V combinations including GaAs, InSb, GaP, and GaSb. The lower portions of fins 412 are separated by isolation regions 414 to prevent leakage from the fins, as shown in FIG. 4A. In an embodiment, isolation regions 414 comprise a dielectric material such as silicon dioxide. In another embodiment, fins 412 are formed from a semiconductor-on-insulator (SOI) substrate comprising a lower bulk substrate, a middle insulation layer, and a top monocrystalline layer. Fins 412 are formed from the top monocrystalline layer, and the middle insulation layer forms an isolation region. The height of fins 412 extending above isolation regions 414 range from 20 to 100 Å. The width of fins 412 range from 5 to 20 Å.

Next, silicon dioxide layer 425 is formed on the surface of fins 412 extending above isolation regions 414. In an embodiment, silicon dioxide layer 425 will form a portion of the gate dielectric for the transistor formed on gate region 492. In an embodiment, silicon dioxide layer 425 will subsequently be removed from gate region 491 prior to forming additional gate structure components. In a specific embodiment, silicon dioxide layer 425 is grown from the surfaces of fins 412. In another specific embodiment, silicon dioxide layer 425 is blanket deposited by any method that enables conformal deposition on the fins 412 in the gate regions, such as chemical vapor deposition (CVD) or atomic layer deposition (ALD). Silicon dioxide layer 425 may be grown or deposited to a uniform thickness. In an embodiment, silicon dioxide layer 425 is 30 Å thick.

The subsequent etching process to remove silicon dioxide layer 425 from gate region 491 involves two sacrificial layers that protect portions of silicon dioxide layer 425 that will form active components of the device formed in gate region 492. In an embodiment of the invention, an embedded etch stop layer 442 is blanket deposited over the surface of the substrate, and a sacrificial silicon dioxide layer 443 is conformally formed over embedded etch stop layer 442. In an embodiment of the invention, embedded etch stop layer 442 and sacrificial silicon dioxide layer 443 will not form active components of the transistors. Embedded etch stop layer 442 and silicon dioxide layer 443 may each be deposited by any method suitable for forming a conformal layer, such as CVD or ALD. In an embodiment, embedded etch stop layer 442 is a material that is etched at a slower rate as compared to that of silicon dioxide when both are etched by a selected etch chemistry. In an embodiment, embedded etch stop layer 442 is silicon nitride.

Both embedded etch stop layer 442 and silicon dioxide layer 443 are each formed to a uniform thickness. The thicknesses of the embedded etch stop layer 442 and silicon dioxide layer 443 are each selected such that a timed etch will remove each layer in approximately the same time. In an embodiment, an HF etching process is used. HF etches silicon dioxide at a faster rate than silicon nitride, and therefore, in an embodiment, sacrificial silicon dioxide layer 443 is thicker than embedded etch stop layer 442. In an embodiment, sacrificial silicon dioxide layer 443 is the same thickness as silicon dioxide layer 425. In an embodiment, embedded etch stop layer 442 is 10 Å thick. In an embodiment, silicon dioxide layer 443 is 30 Å thick.

Figure 4C:
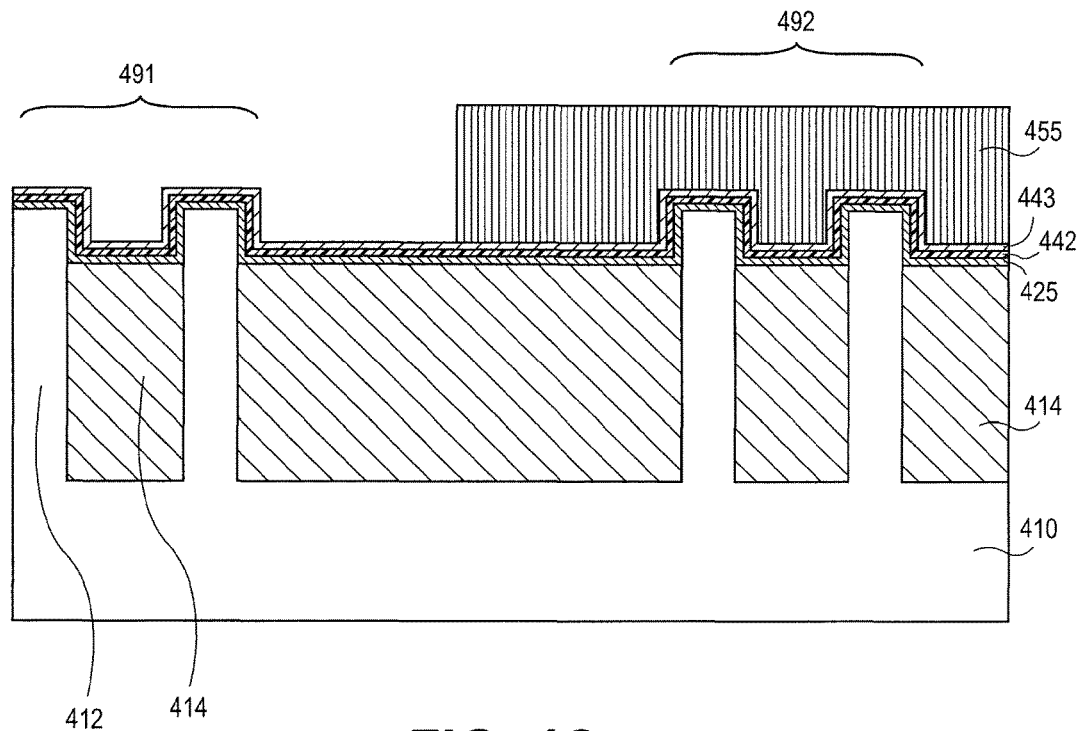

Next, sacrificial silicon dioxide layer 443 is removed from the surface of gate region 491 using a photolithographic etch process. In an embodiment, a photoresist material is formed over the structure surface. The photoresist is photolithographically patterned so that photoresist 455 covers gate region 492, as shown in FIG. 4C, where a gate structure comprising silicon dioxide layer 425 will subsequently be formed. The exposed portion of silicon dioxide layer 443 is then etched from gate structure 491. Silicon dioxide layer 443 may be etched by any suitable etching process, such as a wet etch. The wet etch comprises, for example, HF. The HF etch may have a concentration from 50:1-200:1. In an embodiment, silicon dioxide layer 443 is fully or nearly fully etched from the surface of gate region 491 in 50 seconds.

Figure 4D:
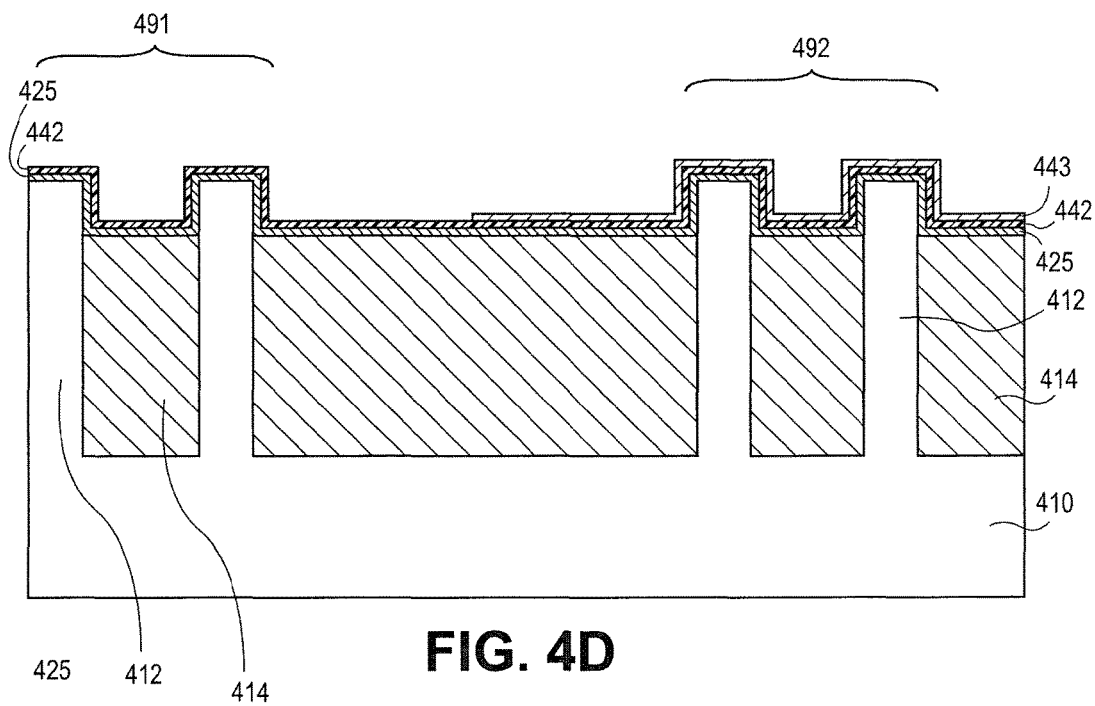

After the etching of silicon dioxide layer 443, photoresist 455 is removed from the structure surface, as shown in FIG. 4D. In general, photoresists are removed by well known processes in the semiconductor industry. Photoresists can be removed, for example, through dry plasma processes. The resist is removed in an oxygen plasma processes, frequently called ashing, designed to remove organic residues. The plasma is generated, for example, by microwave, RF (radio frequency), or UV ozone sources. Alternately, the photoresist can be removed using a solvent or mixture of solvents.

Figure 4E:
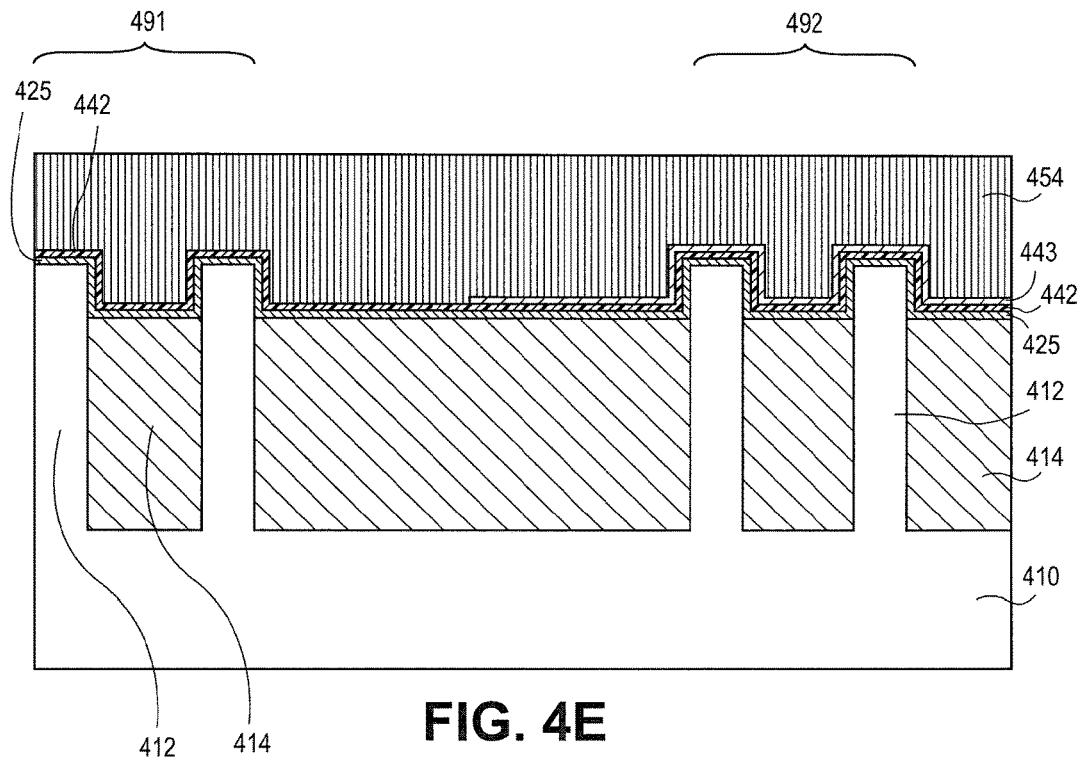

Next, sacrificial gate material 454 is blanket deposited over the structure surface, according to the embodiment illustrated in FIG. 4E. Sacrificial gate material 454 is formed to a thickness desired for the gate height. Sacrificial gate material 454 is then patterned and etched to form sacrificial gate structures 456 over gate regions 491 and 492, so that active gate structures may subsequently be formed by a gate replacement process. Deposition, patterning, and etching of sacrificial gate material are well known in the semiconductor art. The sacrificial gate structures 456 are patterned into the same shape and at the same location where the subsequently formed gate electrode and gate dielectric are to be formed. In an embodiment of the present invention, the sacrificial gate electrode material is formed from a material such as silicon nitride or polysilicon. Following the formation of sacrificial gate structures 456, fins 412 may be doped, for example, by tip implantation or halo implantation, as is well-known in the art.

Figure 4F:
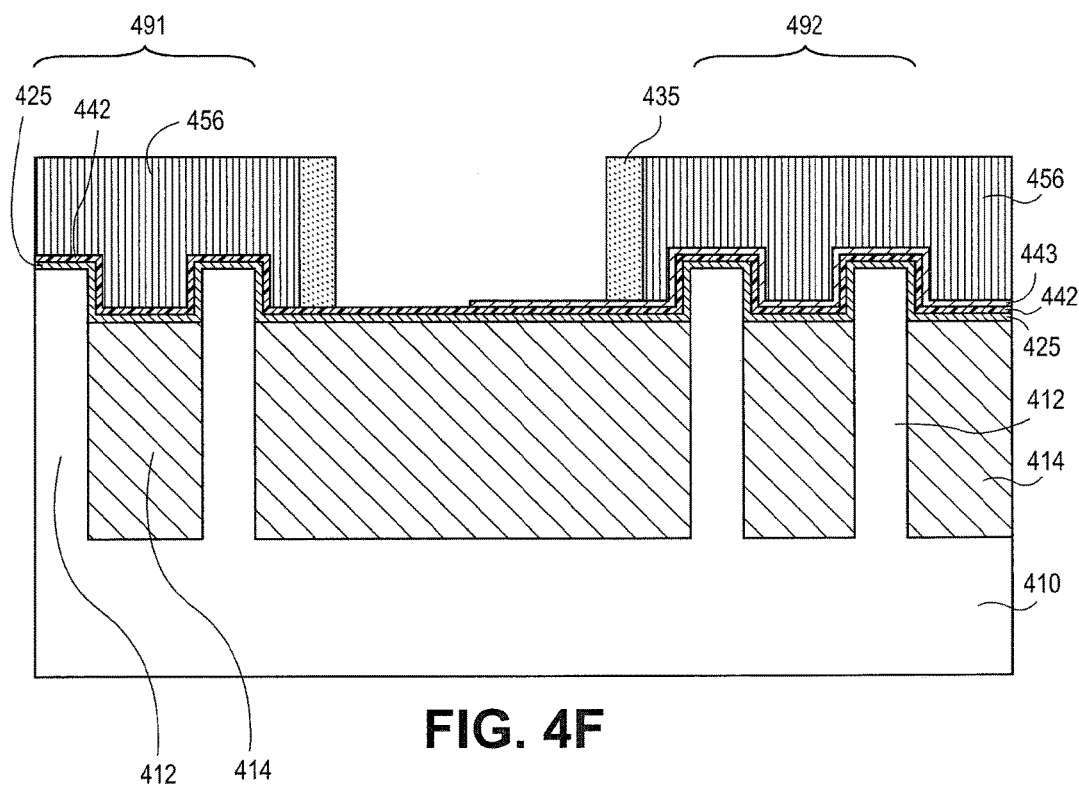

Next, if desired, dielectric sidewall spacers 435 may be formed on the sidewalls of sacrificial gate structures 456. Sidewall spacers are used to isolate the gate structure from epitaxial semiconductor material that may be grown on the source/drain regions of the fins, as shown in FIG. 1A, but spacer material may additionally form on other sidewalls of the gate structure, as shown in FIG. 4F. Sidewall spacers 435 can be formed by any well known technique, such as, for example, by blanket depositing a conformal sidewall spacer dielectric over the substrate, and then anisotropically etching to remove the dielectric spacer material from horizontal surfaces while leaving spacer material on vertical surfaces. The spacers 453 may be silicon nitride, silicon oxide, silicon oxynitride, silicon carbide, CDO or a combination thereof. In an embodiment, an overetch is used to remove spacer material from the sidewalls of fins 412 to enable subsequent growth of an epitaxial layer on the fin surface, doping of the source/drain region, and/or formation of source/drain contacts.

Next, a dielectric material 450 is blanket deposited over the substrate. The dielectric material is formed to a thickness sufficient to completely cover the substrate including sacrificial gate structure 456. The dielectric 450 is formed of a material that can be selectively etched with respect to the sacrificial gate material. That is, the dielectric is formed of a material whereby the sacrificial gate structure 456 can be removed without significantly etching away the dielectric 450. After blanket deposition, the dielectric material 450 is planarized, such as by chemical mechanical planarization (CMP), until the top surface is planar with the sacrificial gate structure 456.

Figure 4G:
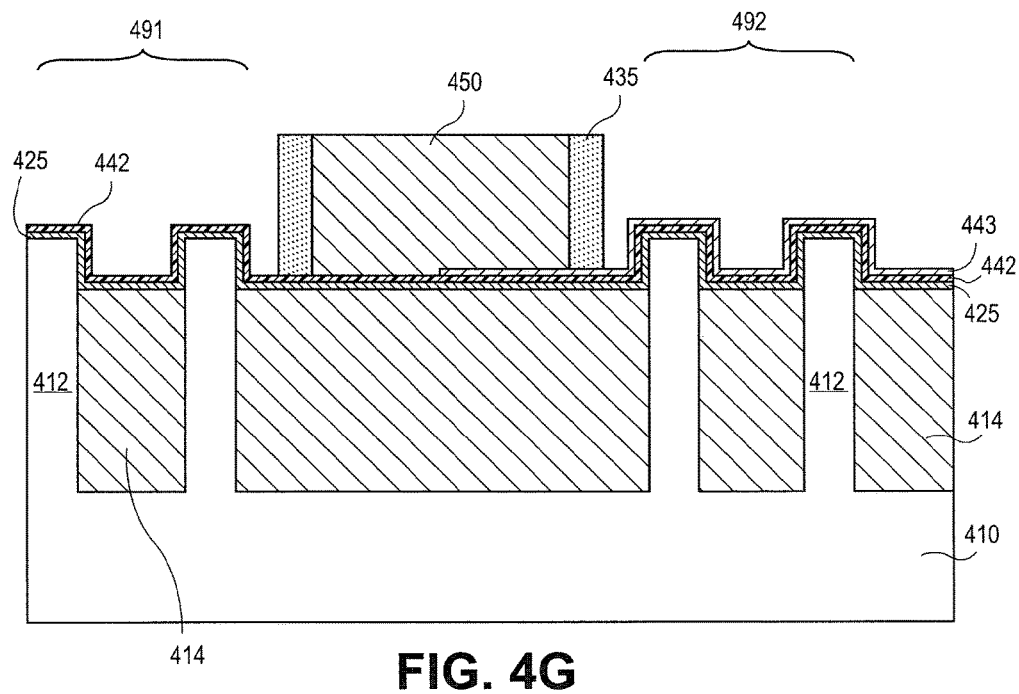
Figure 4H:
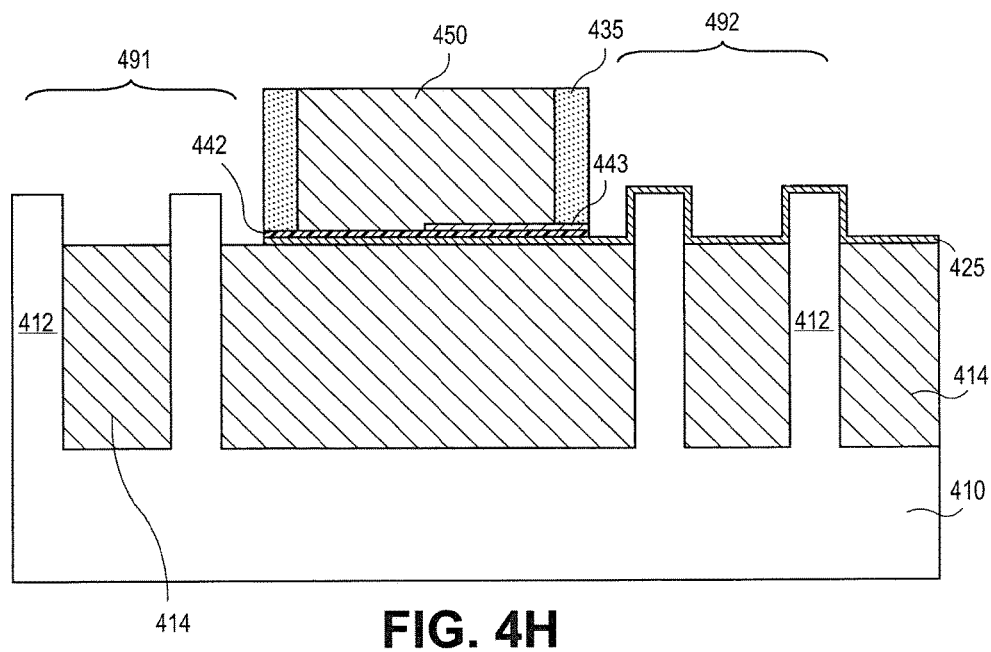

The sacrificial gate structure 456 is then etched away to enable formation of the gate structures in gate regions 491 and 492. Sacrificial gate structures 456 may be removed using a wet or dry etch process. The etch process exposes underlying embedded etch stop layer 442 surface on gate region 491 and underlying sacrificial silicon dioxide layer 443 surface on gate region 492, as shown in FIG. 4G.

In an embodiment, an additional etch process removes embedded etch stop layer 442 and silicon dioxide layer 425 from gate region 491 and also sacrificial silicon dioxide layer 443 and embedded etch stop layer 442 from gate region 492. In an embodiment, a selective etch is used. In another embodiment, a timed wet etch is used. In an embodiment, the timed wet etch may comprise HF. In a specific embodiment, the HF etches embedded etch stop layer 442 material at a faster rate over the sacrificial silicon dioxide 443 material. The etch process has, in an embodiment, a selectivity of 3:1. The HF etch may have a concentration from 50:1-200:1. Because the thickness of each sacrificial layer has been selected based on the rate at which HF etches the material, both embedded etch stop layer 442 and silicon dioxide layer 425 on gate region 491 are etched completely or nearly completely by the HF in the same amount of time that sacrificial silicon dioxide layer 443 and embedded etch stop layer 442 are etched by the HF from gate region 492.

In an embodiment, silicon dioxide layer 425 remains on gate region 492, where it will form part of the gate dielectric. As such, silicon dioxide layer 425 has been formed on gate region 492, without being exposed photoresist, which may contaminate active device layers. This formation of a pristine silicon dioxide layer will improve the performance and reliability of the device over that of devices where active layers are patterned directly using a photolithography process.

Next, a high-k dielectric layer 421 is conformally deposited over the substrate surface to a uniform thickness according to an embodiment of the invention. In an embodiment, high k dielectric material 421 covers the top surface and sidewalls of fins 412 in gate region 491 and conforms to the silicon dioxide layer 425 surface on gate region 492. In an embodiment, high k dielectric layer 421 will form part of the gate dielectric in the gate structures formed in both gate regions 491 and 492. In an embodiment, the high k dielectric material is formed by a conformal process, such as CVD or ALD, to ensure contact with the fin surfaces in gate region 491 and the underlying silicon dioxide layer 425 in gate region 492. High k dielectric layer 421 may be any suitable high k dielectric material, such as described above with respect to high k dielectric layer 121 in FIG. 1A. High k dielectric layer 421 may be from 10 to 50 Å thick. In an embodiment, high k dielectric material 421 is 30 Å thick.

Next, a gate electrode is formed in each gate region, over the gate dielectric. The gate electrode may comprise one or more work function metal layers and a fill metal. In an embodiment, work function metal 431 is conformally deposited over the substrate to a uniform thickness. Work function metal 431 sets the work function for the device, and minimizes resistance at the metal-semiconductor interface between the gate dielectric and the gate electrode. Work function metal 431 is formed by a conformal process, such as CVD or ALD to ensure contact with the underlying high k dielectric layer 421 in both gate regions 491 and 492. Work function metal layer 431 may be any suitable work function metal, such as described above with respect to work function metal layer 131 in FIG. 1A. Work function metal layer 431 may be from 10 to 50 Å thick. In an embodiment, work function metal layer 431 is 30 Å thick.

A fill metal 440 is then blanket deposited over work function metal 431 to a thickness sufficient to fill the gate structure openings in gate regions 491 and 492. Metal gate 440 may be formed by any suitable process, such as CVD, ALD, or physical vapor deposition (PVD). The metal gate material may be any suitable gate electrode material, such as described above with respect to FIG. 1A.

Figure 4I:
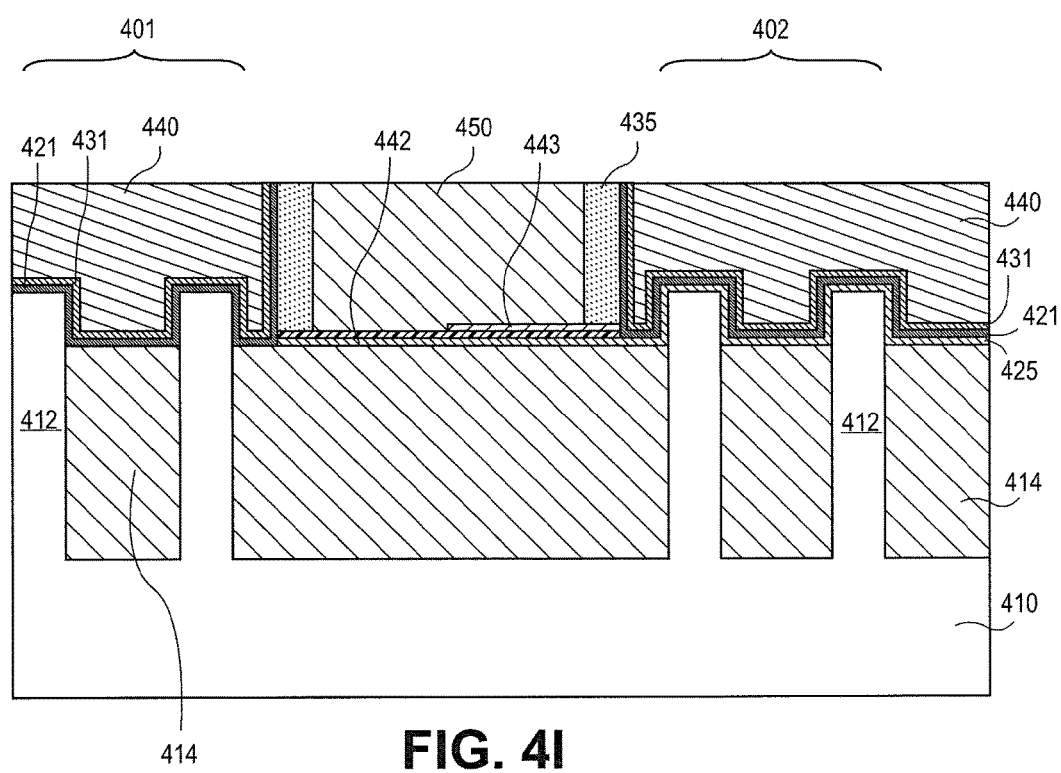

The metal gate 440, work function material 431, and high k dielectric layer 421 are then chemically mechanically planarized until the top surface of the dielectric layer 450 is revealed as shown in FIG. 4I. Once the gate electrode material and gate dielectric material are polished back or removed from the top dielectric material 450, a gate structure has been formed.

Thus, two transistors 401 and 402 are formed, each with a different gate structure. In an embodiment, Transistor 401 comprises a gate dielectric having a high-k material 421 and a gate electrode having both a work function metal 431 and fill metal 440. Transistor 401 may be used for high-performance processor cores. In an embodiment, transistor 402 comprises a gate dielectric having both a silicon dioxide layer 425 and high k dielectric layer 421 and a gate electrode having work function metal layer 431 and fill metal 440. The addition of silicon dioxide layer 425 to the gate dielectric, as compared to the gate dielectric of transistor 401, enables use of transistor 402 for high voltage input-output (I/O) circuits or applications.

FIGS. 5A-I illustrate another method for forming integrated circuits comprising two types of transistors that have different gate structures. An integrated circuit chip typically comprises multiple copies of the same transistor in various locations, however, one of each type of transistor is shown in FIGS. 5A-I for clarity.

Figure 5A:
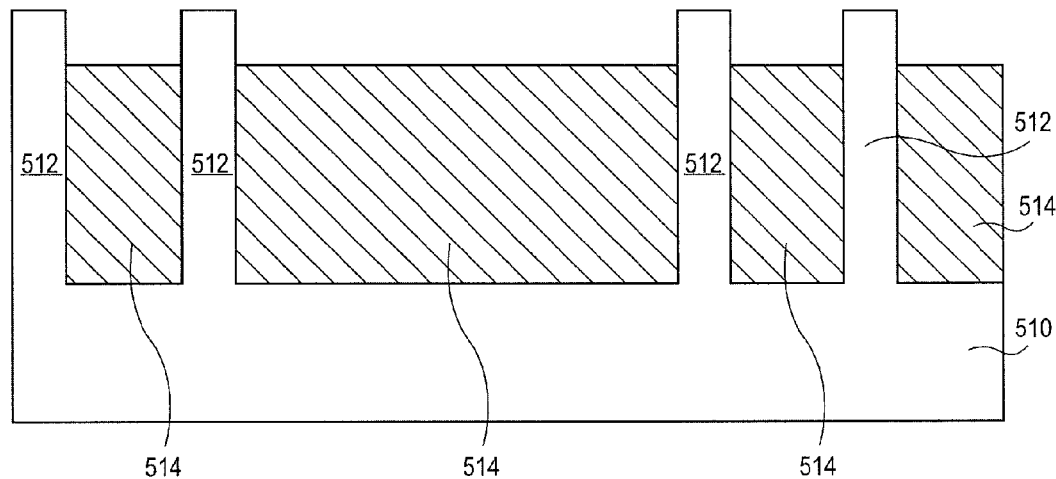
FIGS. 5A-5I illustrate additional methods for forming a single IC having multiple transistors with different gate stack configurations.

A substrate 510 having fins 512 is provided, as shown in FIG. 5A. In an embodiment, substrate 510 and fins 512 are monocrystalline silicon. Fins 512 are separated by isolation regions 514, which may comprise a dielectric material such as, for example, silicon dioxide. Methods for forming the structure shown in FIG. 5A are known in the art of semiconductor manufacturing.

Next, silicon dioxide layer 525 is formed on the surface of the structure. In an embodiment of the invention, silicon dioxide layer 525 will form part of the gate structure subsequently formed in gate region 592. In a specific embodiment, silicon dioxide layer 525 is grown from the surfaces of fins 512. In another specific embodiment, silicon dioxide layer 525 is deposited by any method that enables conformal deposition on the horizontal and vertical surfaces of the gate region, such as CVD or ALD. In an embodiment, silicon dioxide layer 525 is 30 Å thick.

Figure 5B:
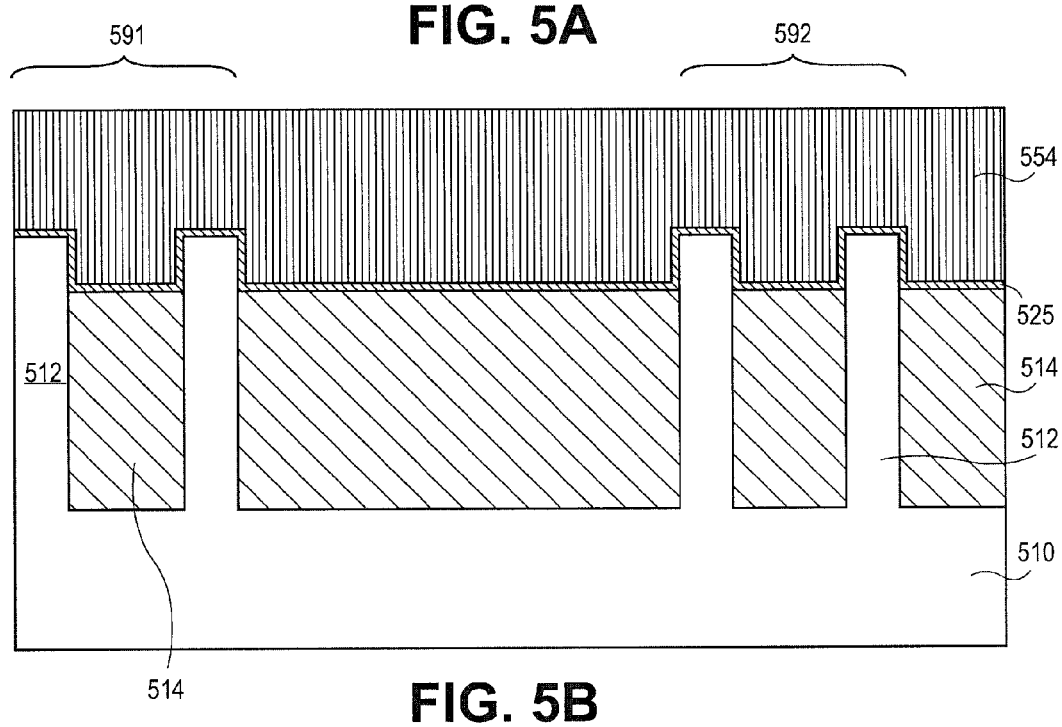

Sacrificial gate structures are then formed so that active gate structures may subsequently be formed by a gate replacement process, according to an embodiment of the invention. In an embodiment, sacrificial gate material 554 is blanket deposited over silicon dioxide layer 525, as shown in FIG. 5B. Sacrificial gate material 554 is formed to a thickness desired for the gate height. Sacrificial gate material 554 is then patterned and etched to form sacrificial gate structures 556 over gate regions 591 and 592. Deposition, patterning, and etching of sacrificial gate material are well known in the semiconductor art. The sacrificial gate structures 556 are patterned into the same shape and at the same location where the subsequently formed gate electrode and gate dielectric are to be formed. In an embodiment of the present invention, sacrificial gate structure 556 is formed from a material such as silicon nitride or polysilicon. Following the formation of sacrificial gate structures 556, fins 512 may be doped, for example, by tip implantation or halo implantation, as is well-known in the art.

Figure 5C:
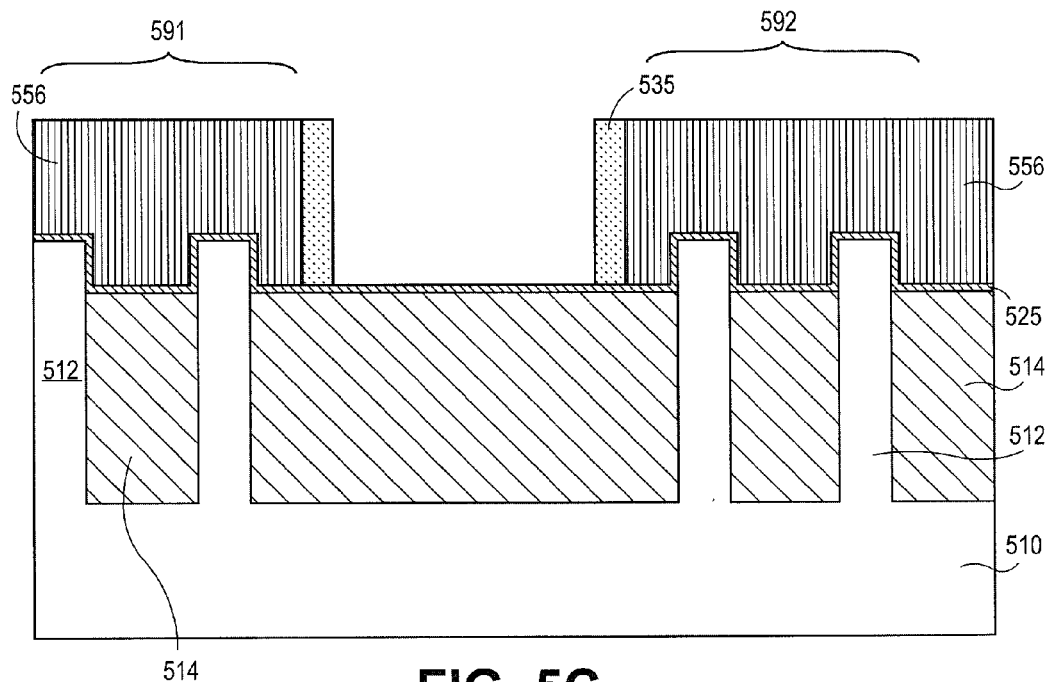

Next, if desired, dielectric sidewall spacers 535 may be formed on the sidewalls of sacrificial gate structures 556. Sidewall spacers are used to isolate the gate structure from epitaxial semiconductor material that may be grown on the source/drain regions of the fins, as shown in FIG. 1A, but spacer material may additionally form on other sidewalls of the gate structure, as shown in FIG. 5C. Sidewall spacers 535 can be formed by any well known technique, such as, for example, by blanket depositing a conformal sidewall spacer dielectric over the substrate, and then anisotropically etching to remove the dielectric spacer material from horizontal surfaces while leaving spacer material on vertical surfaces. The spacers 553 may be silicon nitride, silicon oxide, silicon oxynitride, silicon carbide, CDO or a combination thereof. In an embodiment, an overetch is used to remove spacer material from the sidewalls of fins 512 to enable subsequent growth of an epitaxial layer on the fin surface, doping of the source/drain region, and/or formation of source/drain contacts.

Next, a dielectric material 550 is blanket deposited over the substrate. The dielectric layer is formed to a thickness sufficient to completely cover the substrate including sacrificial gate structure 556. The dielectric layer 550 is formed of a material that can be selectively etched with respect to the sacrificial gate material. That is, the dielectric material is formed of a material whereby the sacrificial gate structure 556 can be removed without significantly etching away the dielectric layer 550. After blanket depositing the dielectric, the dielectric layer is planarized, for example, by CMP, until the top surface of the dielectric film is planar with the sacrificial gate structure 556.

Figure 5D:
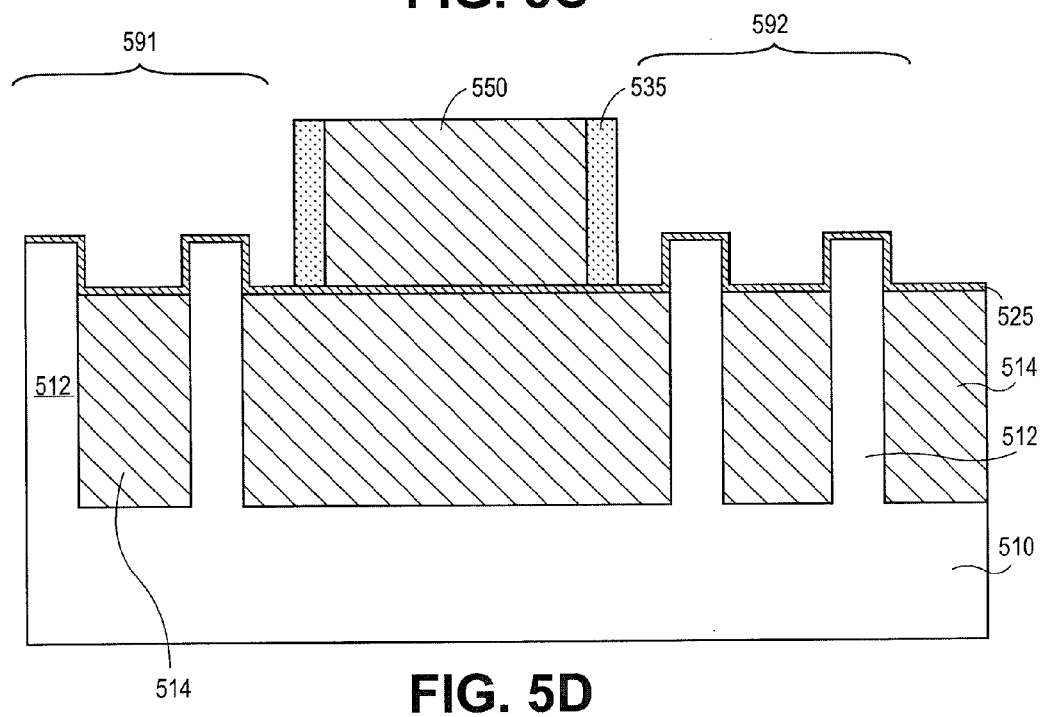

Next, the sacrificial gate structures 556 are etched away to enable formation of gate structures within gate regions 591 and 592. Sacrificial gate structures 556 may be etched using a wet or dry etch process. Etching sacrificial gate structures 556 exposes silicon dioxide layer 525 within gate regions 591 and 592, as shown in FIG. 5D. In an embodiment, the gate dielectric formed in gate region 592 will comprise silicon dioxide layer 525, but the gate structure formed in gate region 592 will not comprise silicon dioxide layer 525. Thus, silicon dioxide layer 525 is subsequently patterned to remove the portion within gate region 591, while protecting the portions within gate region 592. In another specific embodiment of the invention, all exposed portions of silicon dioxide layer 525 are etched away from the surface, and a fresh silicon dioxide layer is either grown from the fins or deposited over the substrate, in order to have pristine silicon dioxide with which to form active components of a subsequently formed gate structure.

Figure 5E:
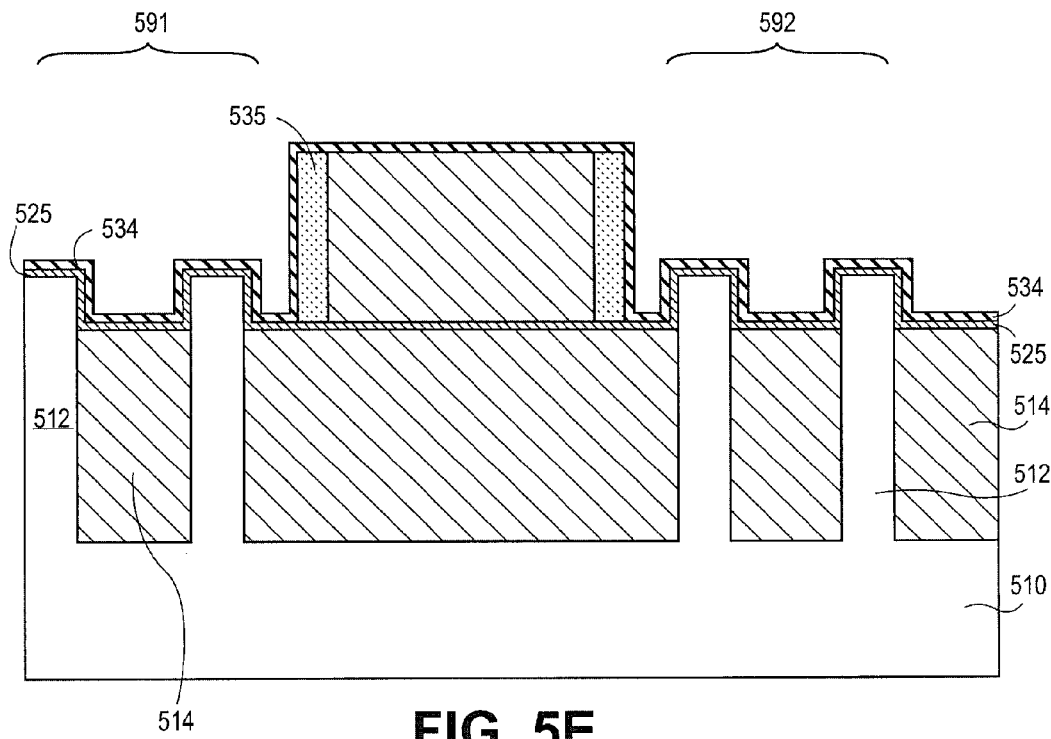

A hardmask 534 is then blanket deposited over silicon dioxide layer 525, as illustrated in FIG. 5E. In an embodiment, hardmask 534 will protect the portion of silicon dioxide layer 525 within gate region 592 from exposure to photoresist during etching of the portion of silicon dioxide layer 525 within gate region 591. Hardmask 534 may comprise, for example, a work function metal resistant to etching by HF, such as, but not limited to titanium nitride, tungsten nitride, and tantalum nitride. In an embodiment, hardmask 534 is formed by ALD. Hardmask 534 is formed to a uniform thickness sufficient to protect underlying materials during the subsequent etching processes, from 10 to 50 Å thick. In an embodiment, hardmask 534 is 30 Å thick.

Figure 5F:
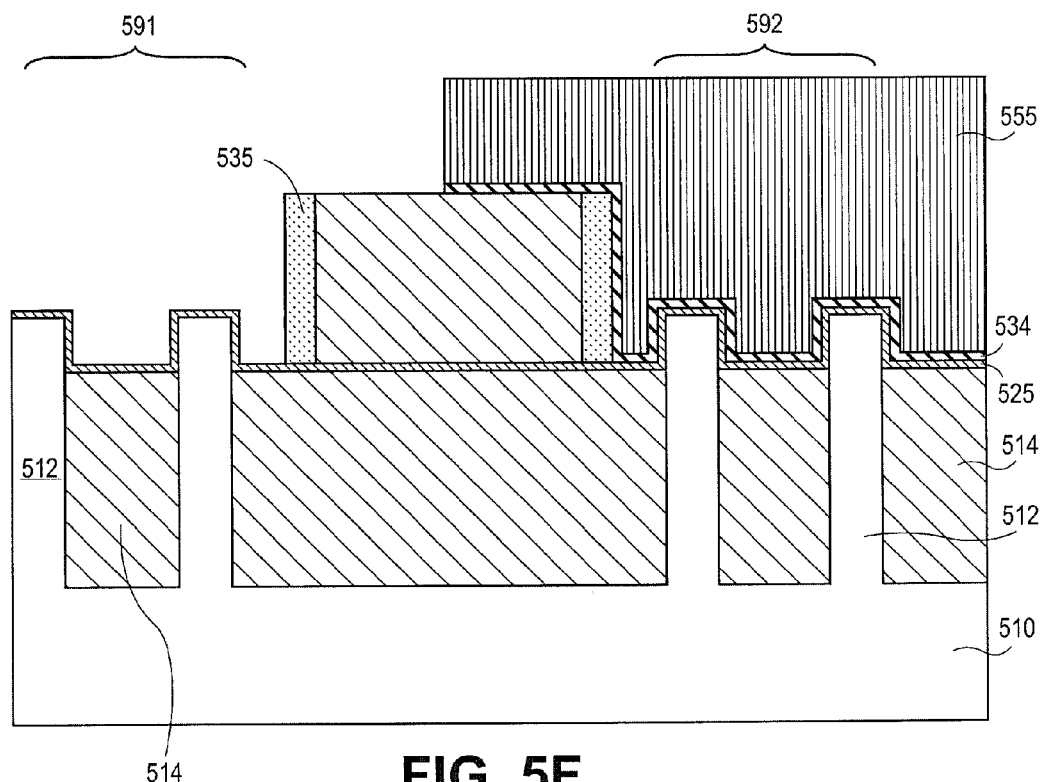
Figure 5G:
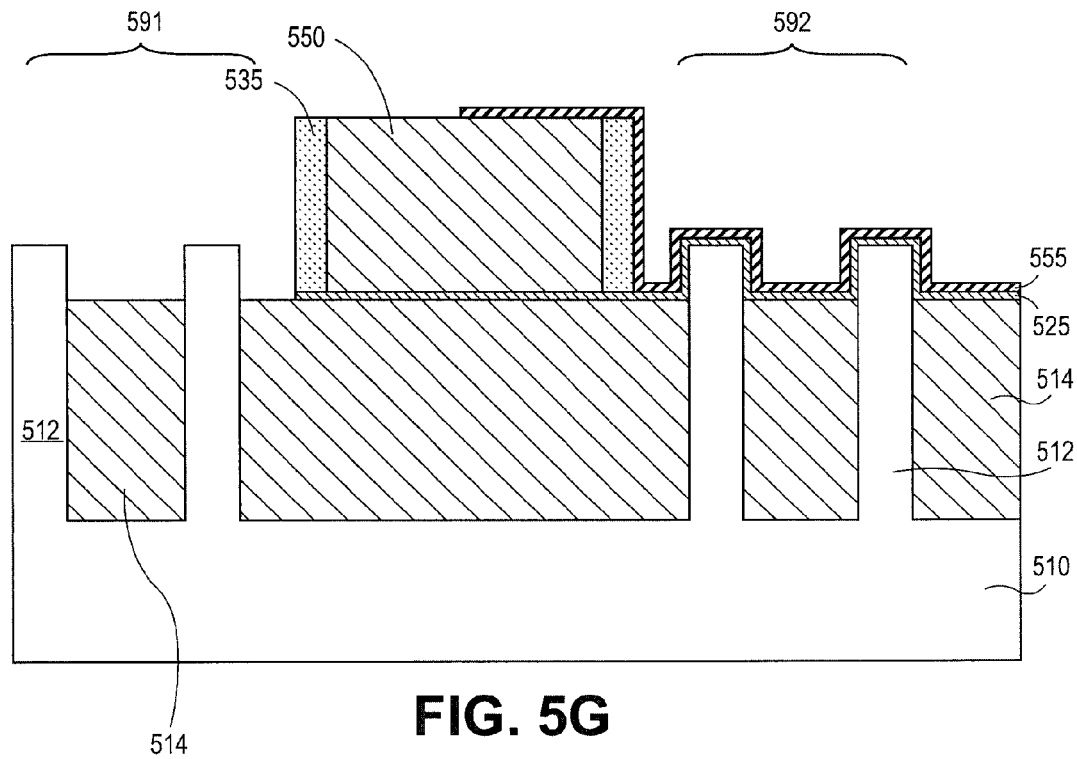

Next, hardmask 534 is patterned to remove the portion covering silicon dioxide layer 525 within gate region 591, as shown in FIG. 5F. In an embodiment, hardmask 534 is patterned by a photolithography process. In an embodiment, a photoresist layer 555 is deposited and patterned such that hardmask 534 on gate region 592 is covered by photoresist. In an embodiment, hardmask 534 is then etched from regions not covered by the photoresist, exposing the underlying silicon dioxide layer 525 on gate region 591. In an embodiment, hardmask 534 is etched using a wet etch process which is highly selective to the underlying oxide, such as peroxide and sulfuric acid.

Figure 5H:
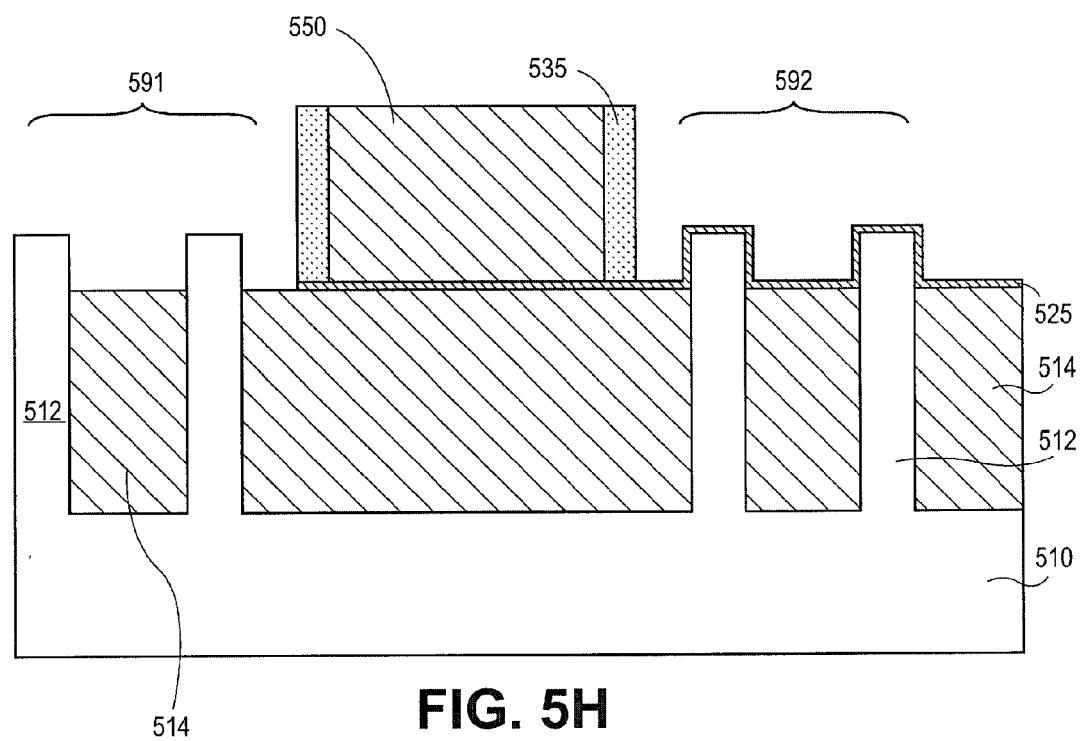

Next, the photoresist layer 545 is removed, leaving hardmask 534 on gate region 592. In an embodiment, silicon dioxide layer 525 is then etched from gate region 591. By removing photoresist layer 545 prior to etching silicon dioxide layer 525, the etching bath used to etch silicon dioxide layer 525 is not contaminated by the photoresist material. In an embodiment, etching silicon dioxide layer 525 over gate region 591 exposes the surfaces of fins 512 and isolation regions 514 in gate region 591. Any etch selective to the hardmask material over silicon dioxide may be used to etch silicon dioxide layer 525. In an embodiment, silicon dioxide layer 525 is etched using HF. In an embodiment, hardmask 534 is then removed from gate region 592 to expose silicon dioxide layer 525, as shown in FIG. 5H. In an embodiment, hardmask 534 is removed by a wet etch process, such as peroxide and sulfuric acid.

The gate structure is then formed by depositing additional gate dielectric layers and gate electrode materials. In an embodiment, a high k dielectric layer 521 is conformally deposited over the substrate, covering the top surface and sidewalls of the fins in gate region 591 and conforming to the silicon dioxide layer 525 surface on gate region 592. The high k dielectric material is formed by a conformal process, such as CVD or ALD, to ensure contact with the fins in gate region 591 or with underlying first silicon dioxide layer 525 in gate region 592. High k dielectric layer 521 may be any suitable high k dielectric material, such as described above with respect to high k dielectric layer 121 in FIG. 1A. High k dielectric layer 521 may be from 10 to 50 Å thick. In an embodiment, high k dielectric material 521 is 30 Å thick.

Next, the gate electrodes are formed. Each gate electrode may comprise one or more work function metal layers and a fill metal. In an embodiment, work function metal 531 is conformally deposited over the substrate. Work function metal 531 is formed by a conformal process, such as CVD or ALD to ensure contact with underlying high k dielectric layer 521. Work function metal layer 531 may be any suitable work function metal, such as described above with respect to work function metal layer 131 in FIG. 1A. Work function metal layer 531 may be from 10 to 50 Å thick. In an embodiment, work function metal layer 531 is 30 Å thick.

Next, the fill metal 540 material is blanket deposited over work function metal 531 to a thickness sufficient to fill the gate structure openings within gate regions 591 and 592. Fill metal 540 may be formed by any suitable process, such as CVD, ALD, or PVD. The fill metal material may be any suitable gate electrode material, such as described above with respect to fill metal 140 in FIG. 1A.

Figure 5I:
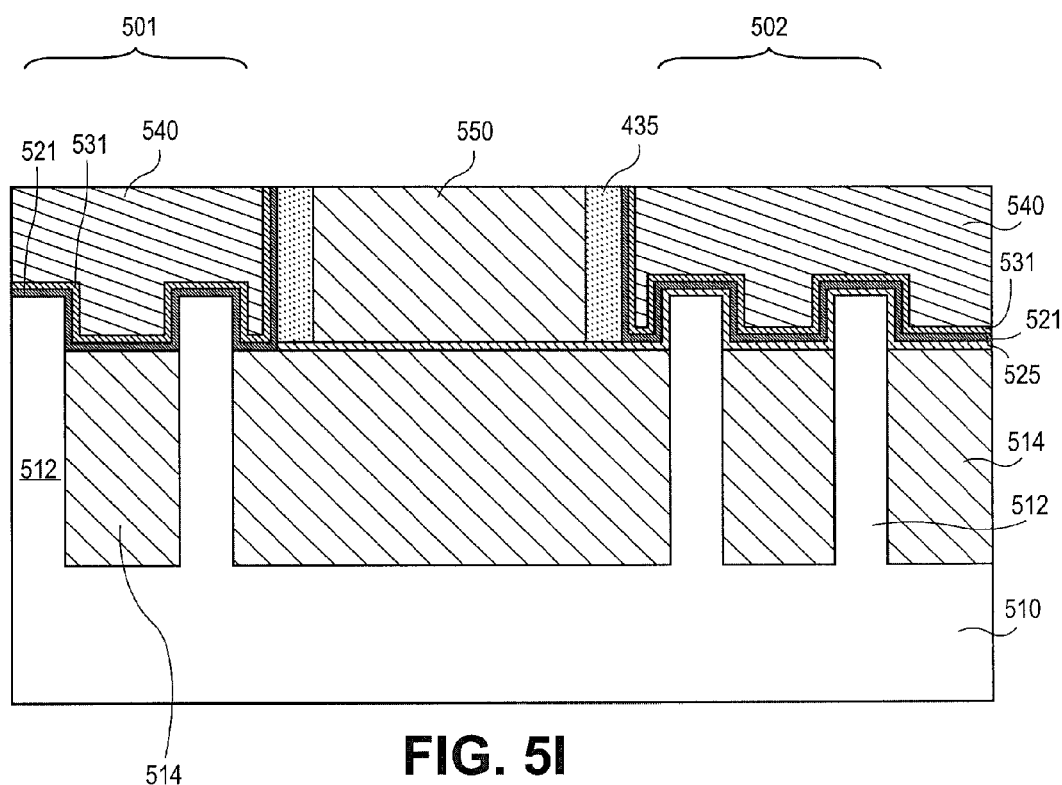

The fill metal 540, work function material 531, and high k dielectric layer 521 are then chemically mechanically planarized until the top surface of the dielectric layer 550 is revealed as shown in FIG. 5I. Once the gate electrode material and gate dielectric material are polished back or removed from the top dielectric material 550, a gate structure has been formed.

Thus, two transistors 501 and 502 are formed, each with a different gate structure. In an embodiment, transistor 501 comprises a gate dielectric having high k dielectric material 521 and a gate electrode having both work function metal 531 and fill metal 540. The gate structure of transistor 501 may be used for high-performance processor cores. In an embodiment, transistor 502 comprises a gate dielectric having a silicon dioxide layer 525 and high k dielectric layer 521 over silicon dioxide layer 525, and a gate electrode having both work function metal 531 and fill metal 540. As compared to transistor 501, the additional silicon dioxide material in the gate dielectric of transistor 502 enables use for high voltage input-output (I/O) circuits.

FIGS. 6A-G provide an additional embodiment of a method for forming integrated circuits comprising two types of transistors, where each transistor type has a different gate dielectric structure. An integrated circuit chip typically comprises multiple copies of the same transistor in various locations, however, one of each type of transistor is shown in FIGS. 6A-G for clarity.

Figure 6A:
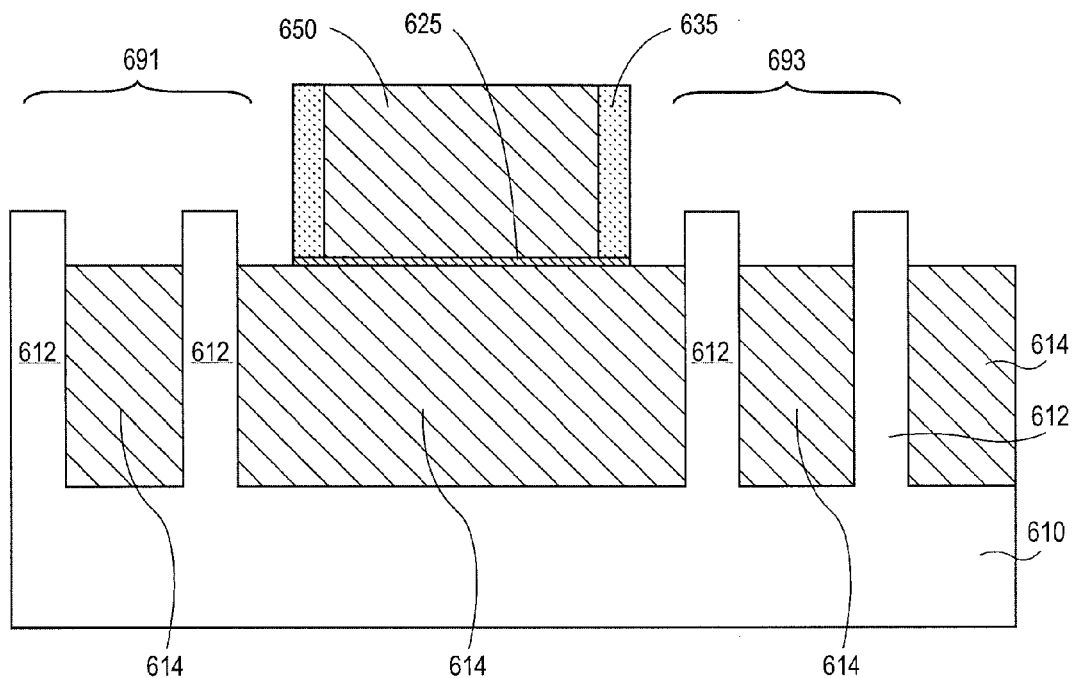
FIGS. 6A-6G illustrate additional methods for forming a single IC having multiple transistors with different gate stack configurations.

A structure comprising substrate 610 with fins 612 separated by isolation regions 614 and gate structure openings above the fins defined by a dielectric 650 having spacers 635 is provided. Methods for forming the structure are known in the art of semiconductor manufacturing. The structure may be formed, for example, by first following the process shown in FIGS. 5A-5D and described above, and then removing the portions of the silicon dioxide layer 625 that cover gate regions 691 and 693, as shown in FIG. 6A. In an embodiment, silicon dioxide layer 625 is removed from gate regions 691 and 693 by wet or dry etch.

Next, a high k dielectric layer 622 is blanket deposited over the substrate. High k dielectric material 622 is formed by a conformal process, such as CVD or ALD, to ensure contact with the fins in each gate region. In an embodiment, high k dielectric layer 622 will form part of the gate dielectric for the transistor formed in gate region 693. In an embodiment, high k dielectric layer 622 will be removed from gate region 691. High k dielectric layer 622 may be any suitable high k dielectric material, such as described above with respect to high k dielectric layer 122 in FIG. 1B. High k dielectric layer 622 may be from 10 to 50 Å thick. In an embodiment, high k dielectric material 622 is 30 Å thick.

Figure 6B:
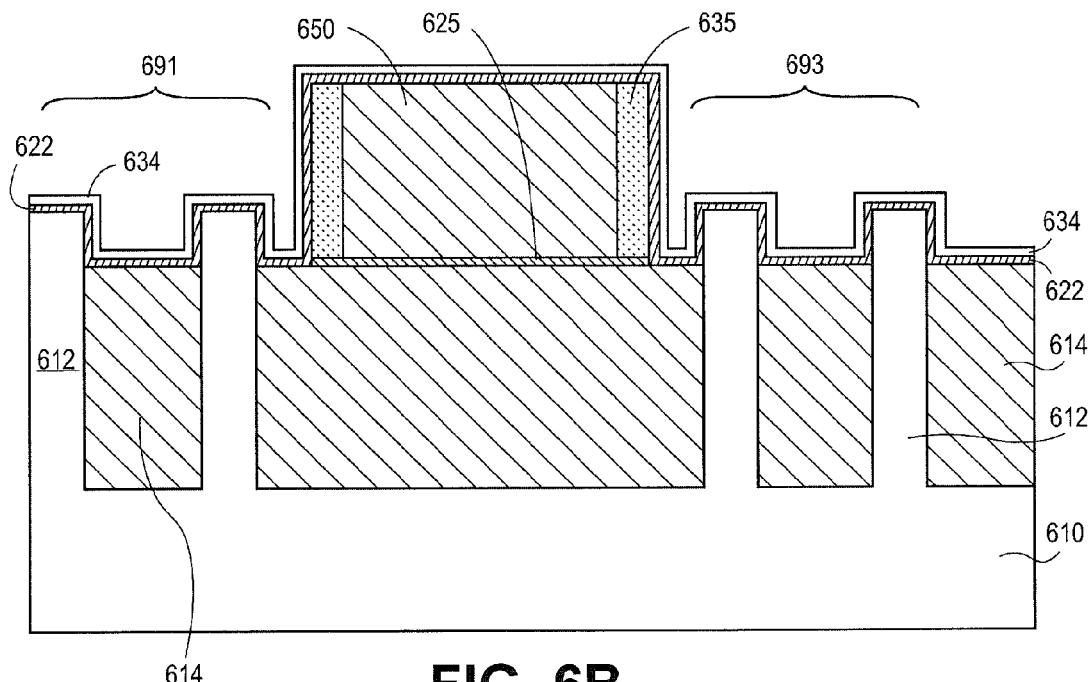

A hardmask 634 is then blanket deposited over high k dielectric layer 622, as illustrated in FIG. 6B. In an embodiment, hardmask 634 will protect the portion of high k dielectric layer 622 within gate region 693 from exposure to photoresist during the subsequent etching of high k dielectric layer 622 from gate region 691. Hardmask 634 may comprise, for example, a work function metal resistant to etching by HF, such as, but not limited to titanium nitride, tungsten nitride, and tantalum nitride. In an embodiment, hardmask 634 is formed by ALD. Hardmask 634 is formed to a uniform thickness sufficient to protect underlying materials during the subsequent etching processes, from 10 to 50 Å thick. In an embodiment, hardmask 634 is 30 Å thick.

Figure 6C:
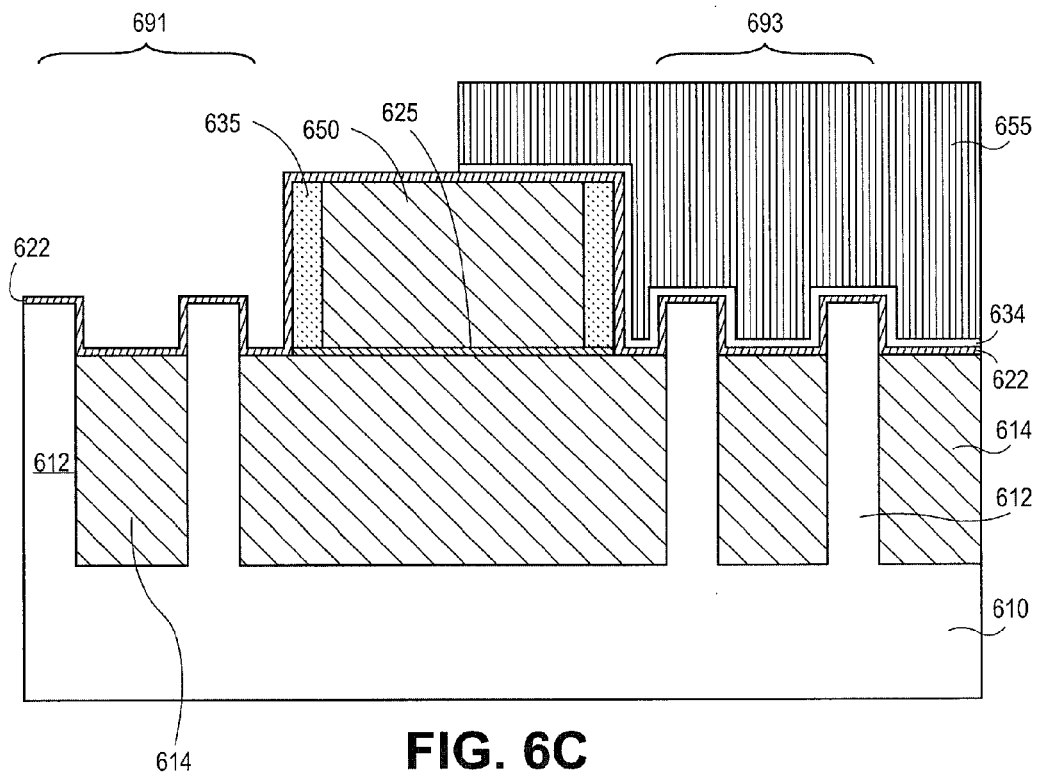

Next, hardmask 634 is patterned to remove the portion covering high k dielectric layer 622 within gate region 691, as shown in FIG. 6C. In an embodiment, hardmask 634 is patterned by a photolithography process. In an embodiment, a photoresist layer 655 is deposited and patterned such that hardmask 634 on gate region 693 is covered by photoresist. Hardmask 634 is then etched to expose high k dielectric layer 622 in gate region 691. In an embodiment, hardmask 634 is etched using a wet etch process that is highly selective to the underlying oxide, such as peroxide and sulfuric acid.

Figure 6D:
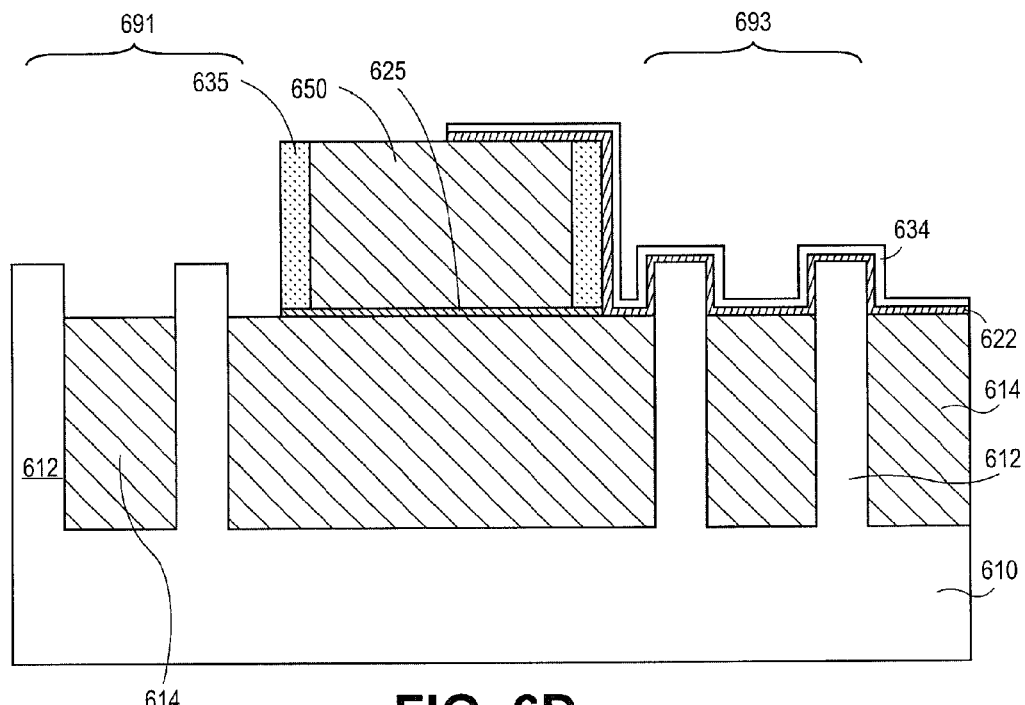
Figure 6E:
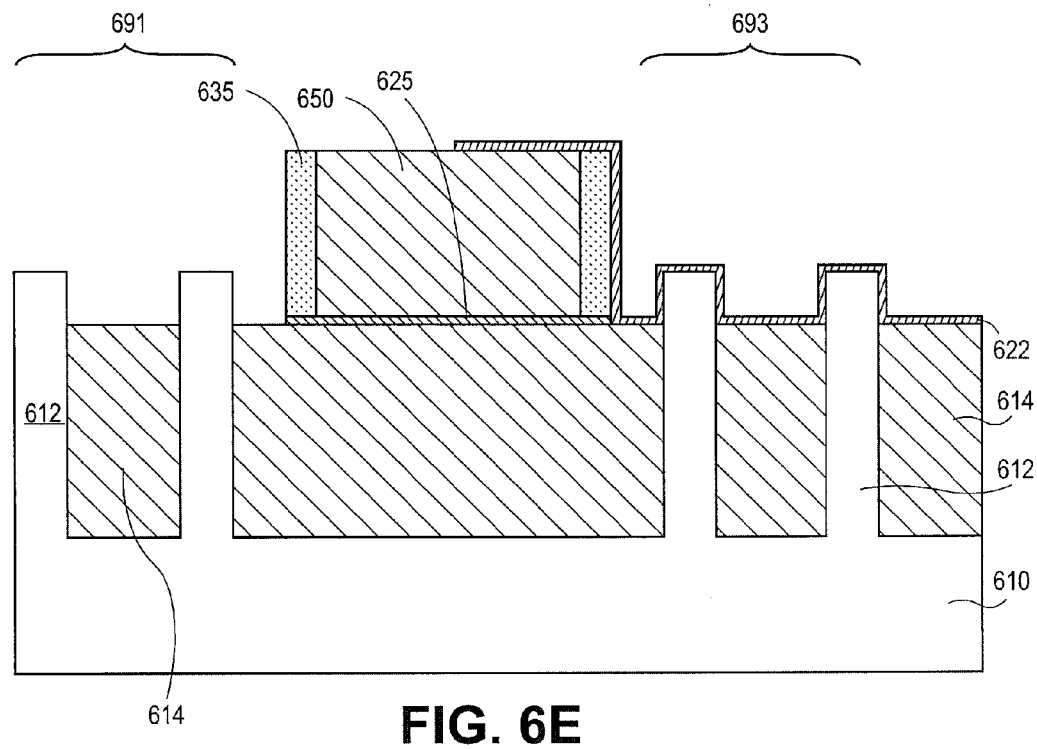
Figure 6F:
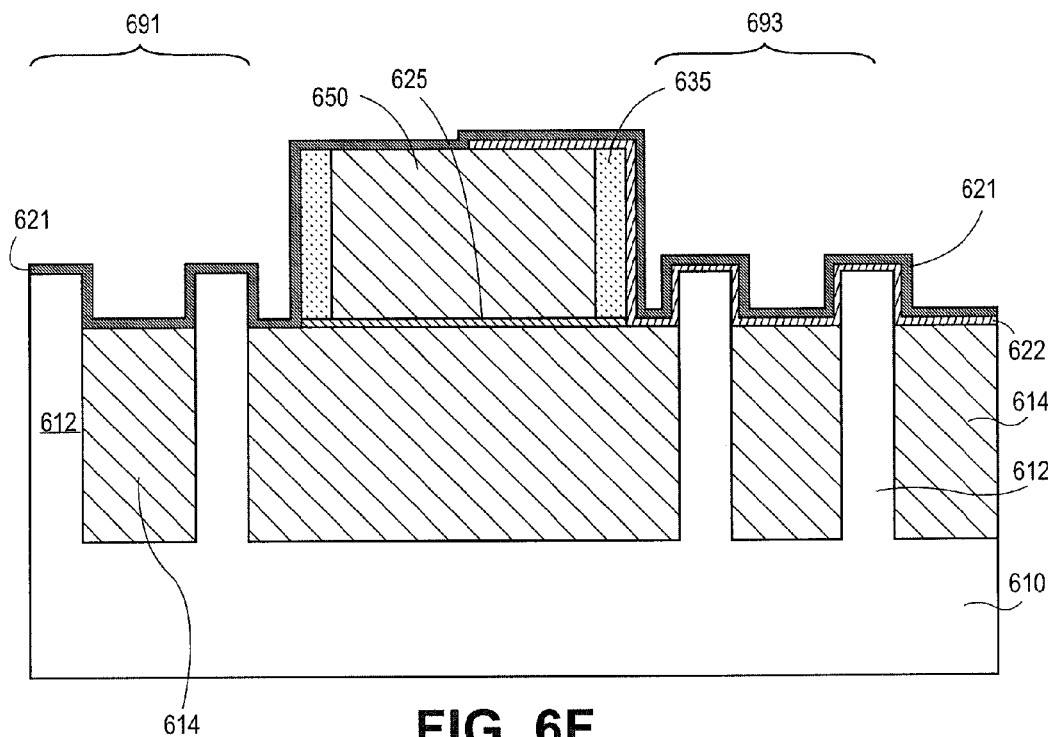

The photoresist layer 655 is then removed, leaving hardmask 634 on gate region 693. The exposed portion of high k dielectric layer 622 over gate region 691 is then etched to expose the surfaces of fins 612 and isolation regions 614 in gate region 691, as shown in FIG. 6D. By removing photoresist layer 655 prior to etching high k dielectric layer 622 on gate region 691, the etching bath used to etch high k dielectric layer 622 is not contaminated by the photoresist material. Any etch selective to the hardmask material over the high k dielectric material may be used to etch high k layer 622. In an embodiment, high k dielectric layer 622 is etched using HF. In an embodiment, hardmask 634 is then removed from gate region 693 to expose the surface of high k dielectric layer 622, as shown in FIG. 6E. In an embodiment, hardmask 634 is removed by a wet etch process, such as peroxide and sulfuric acid.

Next, a high k dielectric layer 621 is conformally deposited over the structure. In an embodiment, high k dielectric layer 621 will form part of the gate dielectric for each of the transistors formed in gate regions 691 and 693. In gate region 691, high k dielectric material 621 covers the fins 612 and isolation regions 614 within the gate structure opening, and in gate region 693, high k dielectric layer 621 conforms to high k dielectric layer 622. High k dielectric material 621 is formed by a conformal process, such as CVD or ALD, to ensure contact with underlying materials in the gate region. In an embodiment, high k dielectric layer 621 has a different composition than high k dielectric layer 622. In another embodiment, high k dielectric layer 621 has a different thickness than high k dielectric layer 622. High k dielectric layer 621 comprises a high k dielectric material such as described above with respect to high k dielectric layer 121 in FIG. 1A. High k dielectric layer 621 may be from 10 to 50 Å thick. In an embodiment, high k dielectric material 621 is 30 Å thick.

Next, a gate electrode is formed. The gate electrode may comprise one or more work function metal layers and a fill metal. In an embodiment, work function metal layer 631 is deposited over the substrate to a uniform thickness. Work function metal layer 631 is formed by a conformal process, such as CVD or ALD, to ensure contact with underlying high k dielectric layer 621. Work function metal layer 631 may be any suitable work function metal, such as described above with respect to work function metal layer 131 in FIG. 1A. Work function metal layer 631 may be from 10 to 50 Å thick. In an embodiment, work function metal layer 631 is 30 Å thick.

Next, the fill metal 640 is blanket deposited over work function metal 631 to a thickness sufficient to fill the gate structure openings over gate regions 691 and 693. Fill metal 640 may be formed by any suitable process, such as CVD, ALD, or PVD. The fill metal may be any suitable gate electrode material, such as described above with respect to fill metal 140 in FIG. 1A.

Figure 6G:
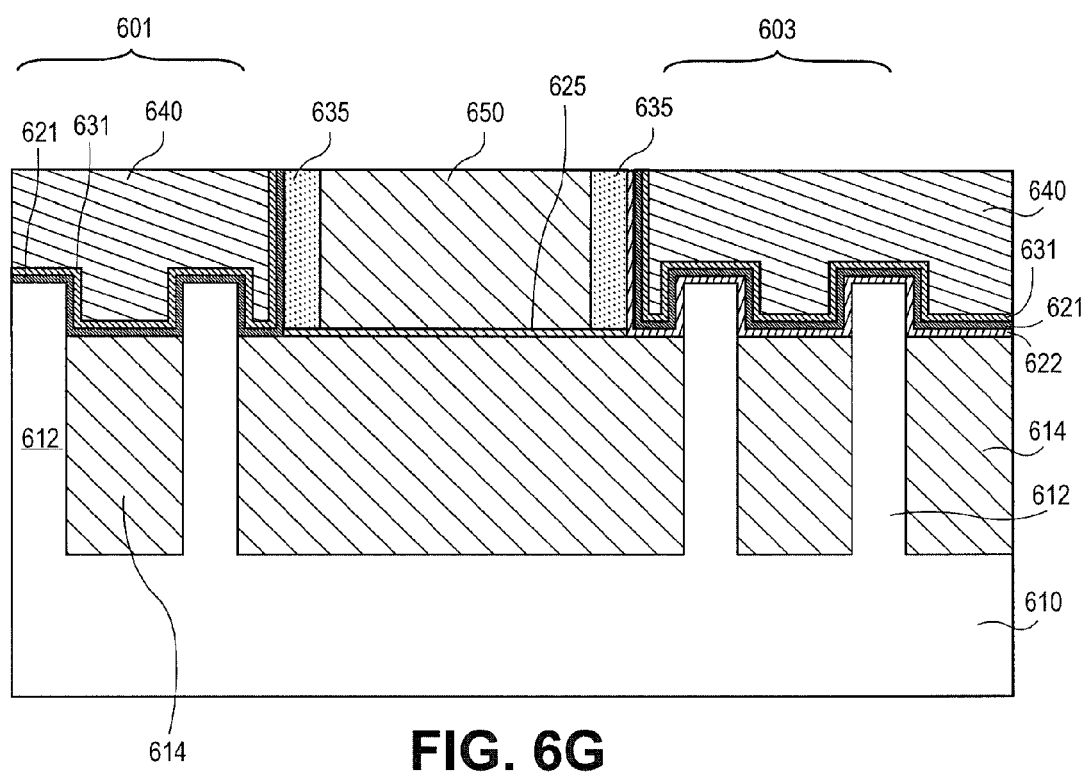

The fill metal 640, work function material 631, high k dielectric layer 621 and high k dielectric layer 622 are then chemically mechanically planarized until the top surface of the dielectric layer 650 is revealed as shown in FIG. 6G. Once the gate electrode materials and gate dielectric materials are polished back or removed from the top of dielectric material 650, a gate structure has been formed.

Thus, two different transistors 601 and 603 are formed, each with a different gate structure. In an embodiment, transistor 601 comprises a gate dielectric having high k material 621 and a gate electrode having work function metal 631 and fill metal 640. The gate structure of transistor 601 enables use for high-performance processor cores. In an embodiment, transistor 603 comprises a gate dielectric having a high k dielectric layer 622 and high k dielectric layer 621, and a gate electrode having work function metal layer 631 and fill metal 640. The dual high k materials enable use of transistor 603 for low-power circuits or applications.

FIGS. 7A-E provide an additional embodiment of a method for forming integrated circuits comprising two types of transistors, where each transistor type has a different gate electrode structure. An integrated circuit chip typically comprises multiple copies of the same transistor in various locations, however, one of each type of transistor is shown in FIGS. 7A-E for clarity.

Figure 7A:
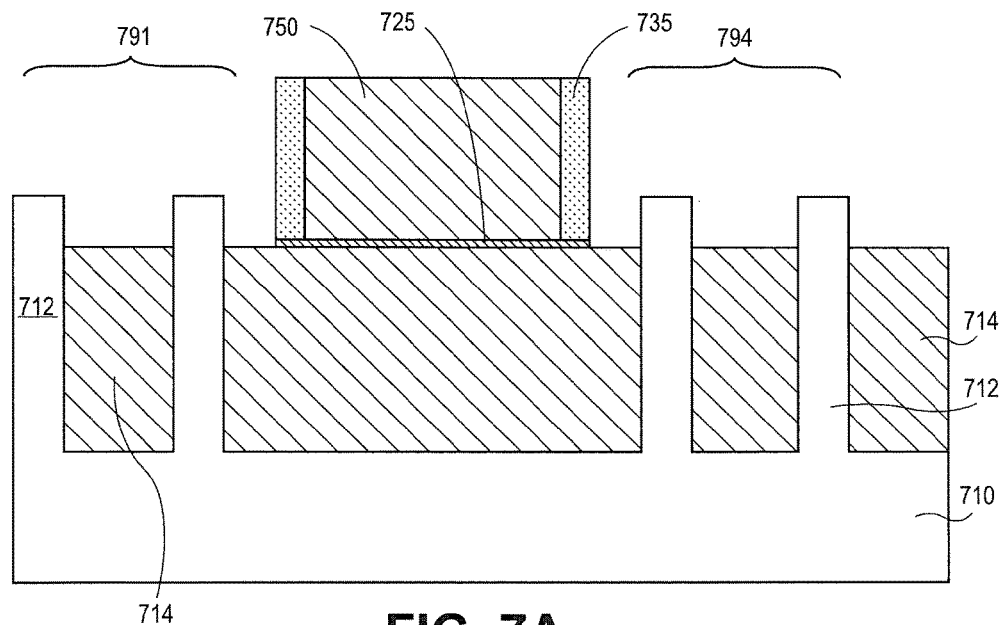
FIGS. 7A-7E illustrate additional methods for forming a single IC having multiple transistors with different gate stack configurations.

A structure comprising substrate 710 with fins 712 separated by isolation regions 714 and gate structure openings above the fins, defined by dielectric material 750 and spacers 735 is provided. Methods for forming the structure are known in the art of semiconductor manufacturing. The structure may be formed, for example, by first following the process shown in FIGS. 5A-5D and described above, and then removing the portions of the silicon dioxide layer 725 that cover gate regions 791 and 794, as shown in FIG. 7A.

Figure 7B:
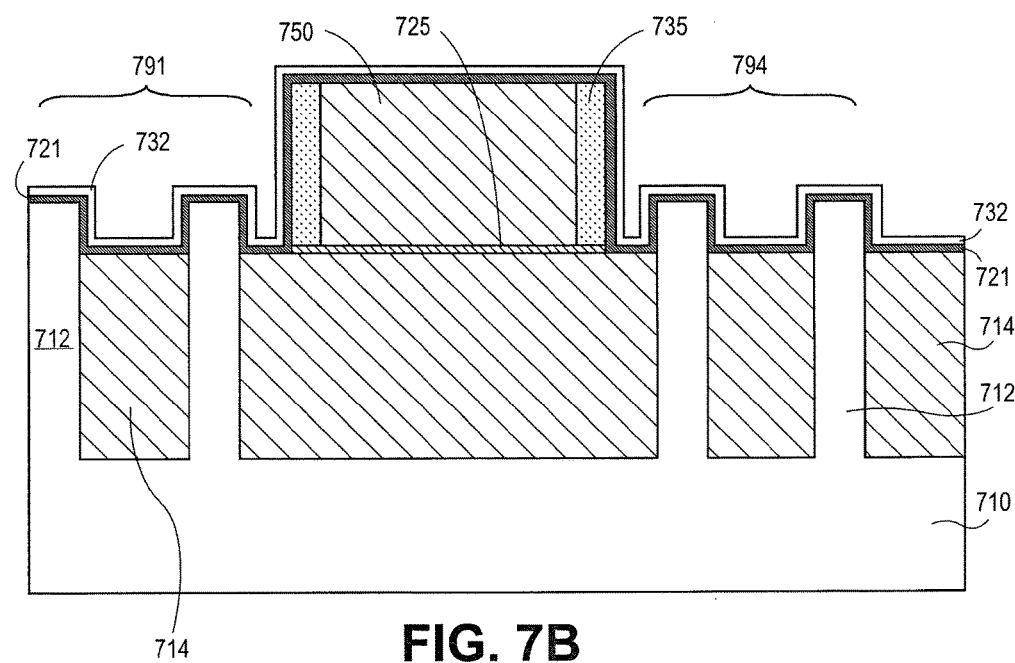

Next, portions of the gate structures are formed by depositing a gate dielectric layer in gate regions 791 and 794. A high k dielectric layer 721 is blanket deposited on the structure surface, as illustrated in FIG. 7B, covering fins 712 and isolation regions 714 within gate regions 791 and 794. The high k dielectric material 721 is formed by a conformal process, such as CVD or ALD, to ensure uniform formation on the surface of fins 712. High k dielectric layer 721 comprises a high k dielectric material such as described above with respect to high k dielectric layer 121 in FIG. 1A. High k dielectric layer 721 may be from 10 to 50 Å thick. In an embodiment, high k dielectric material 721 is 30 Å thick.

Next, work function metal 732 is blanket deposited over the structure, as shown in FIG. 7B. In an embodiment, work function metal layer 732 will form part of the gate electrode for the transistor gate structure formed in gate region 794. In an embodiment, work function metal layer 732 will be subsequently removed from gate region 791. In an embodiment, work function metal 732 conforms to the surface of high k dielectric material 721. The work function metal may be deposited by a conformal process, such as CVD or ALD. Work function metal layer 732 may be any suitable work function metal, such as described above with respect to FIG. 1A. In an embodiment, work function metal layer 732 is nitridized after deposition to alter the work function of the material. Work function metal layer 732 may be from 10 to 50 Å thick. In an embodiment, work function metal layer 732 is 30 Å thick.

Figure 7C:
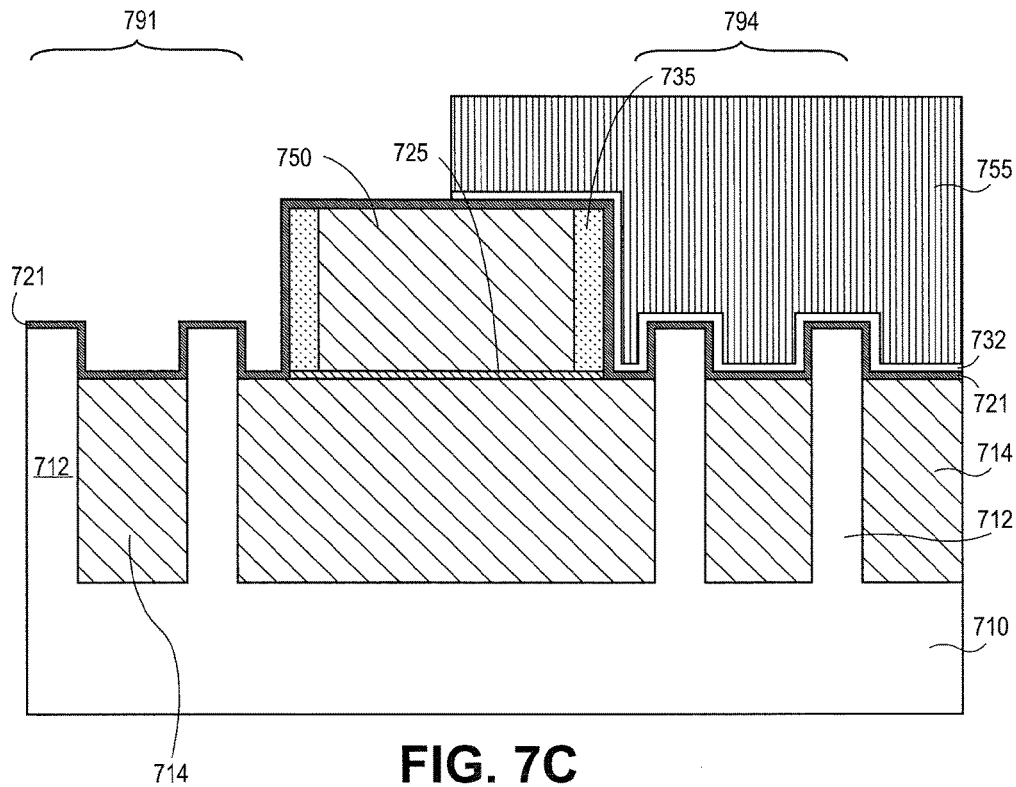
Figure 7D:
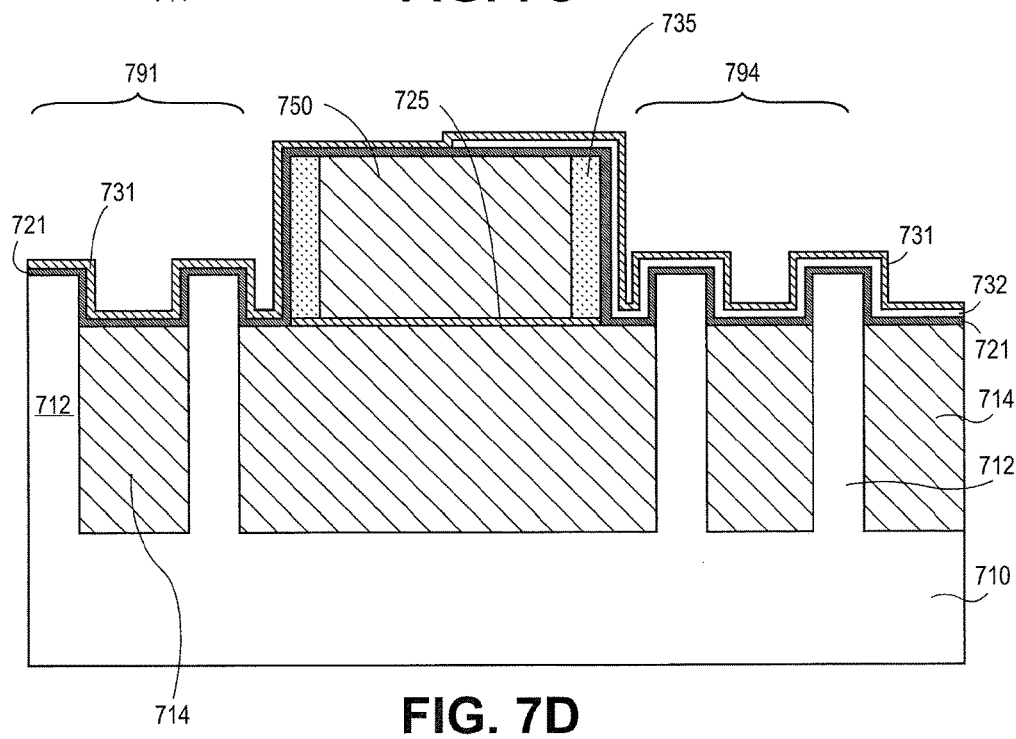

Work function metal layer 732 is then patterned to remove the portion within gate region 791. In an embodiment, work function layer 732 is patterned using photolithography. In an embodiment, photoresist layer 755 is deposited and patterned such that the portion of work function metal layer 732 in gate region 794 is covered by photoresist. In an embodiment, work function metal layer 732 is then etched away from gate region 791 to expose the underlying high k dielectric material 721, as shown in FIG. 7C. Work function metal layer 732 may be etched with either a dry etch or a wet etch process.

Next, photoresist 755 is removed and work function metal layer 731 is blanket deposited over the substrate. Work function metal layer 731 is formed by a conformal process, such as CVD or ALD to ensure contact with the underlying high k dielectric layer 721 on gate region 791 and the work function metal layer 732 on gate region 794. Work function metal layer 731 may be any suitable work function metal, such as described above with respect to FIG. 1A. In an embodiment, work function metal 731 has a different work function than work function metal layer 732. Work function metal layer 731 may be from 10 to 50 Å thick. In an embodiment, work function metal layer 731 is 30 Å thick.

Next, fill metal 740 is blanket deposited over work function metal 731 to a thickness sufficient to fill the gate structure openings over gate regions 791 and 794. Fill metal 740 may be formed by any suitable process, such as CVD, ALD, or PVD. The fill metal may be any suitable gate electrode material, such as described above with respect to FIG. 1A.

Figure 7E:
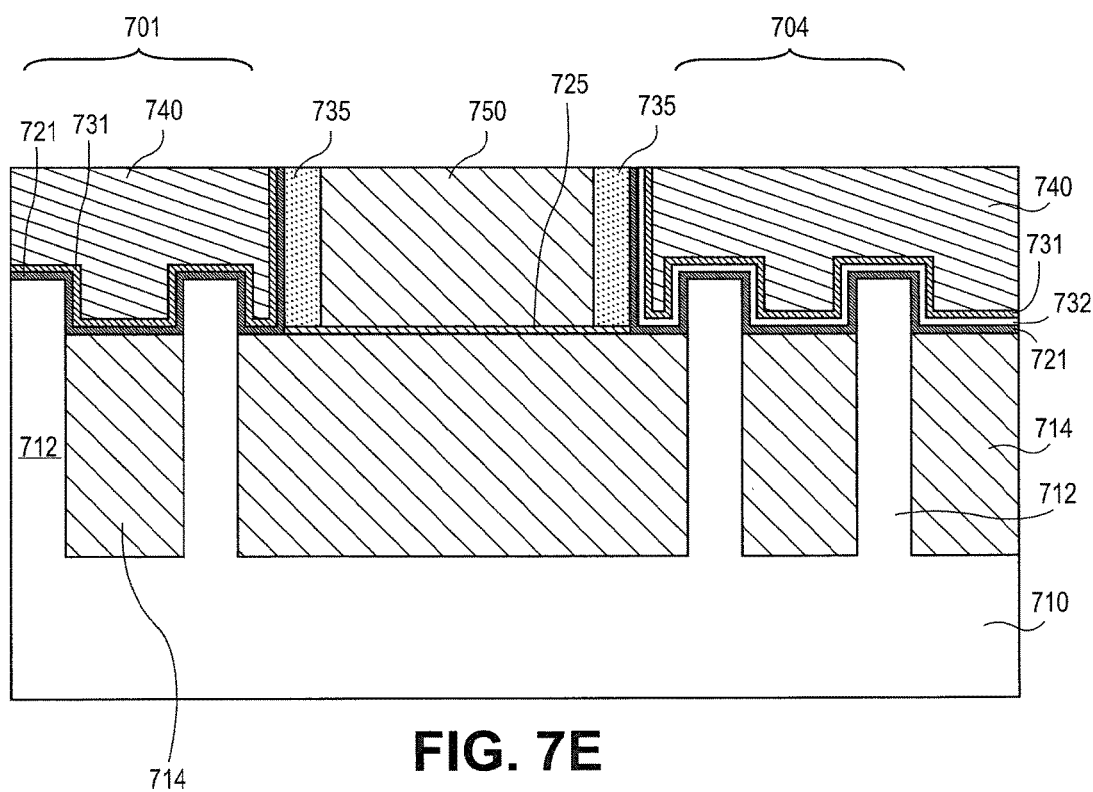

Fill metal 740, work function metal 731, work function metal 732, and high k dielectric layer 721 are then chemically mechanically planarized until the top surface of the dielectric 750 is revealed as shown in FIG. 7E. Once the gate electrode materials and gate dielectric materials are polished back or removed from the top dielectric material 750, a gate structure has been formed.

Thus, two different transistors 701 and 704 are formed, each with a different gate structure. In an embodiment, the gate structure of transistor 701 comprises a gate dielectric having high k material 721 and a gate electrode having both work function metal layer 731 and fill metal 740. Transistor 701 may be used for high-performance processor cores. In an embodiment, the gate structure of transistor 704 comprises a gate dielectric having high k material 721 and a gate electrode having work function metal 732, work function metal 731, and fill metal 740. Transistor 704 may be used in low-power circuits or applications.

The above processes, as described with reference to FIGS. 4A-I, 5A-I, 6A-G, and 7A-E can be used in combination to form integrated circuits with three or more types of transistors, each having a different gate structure.

Figure 8:
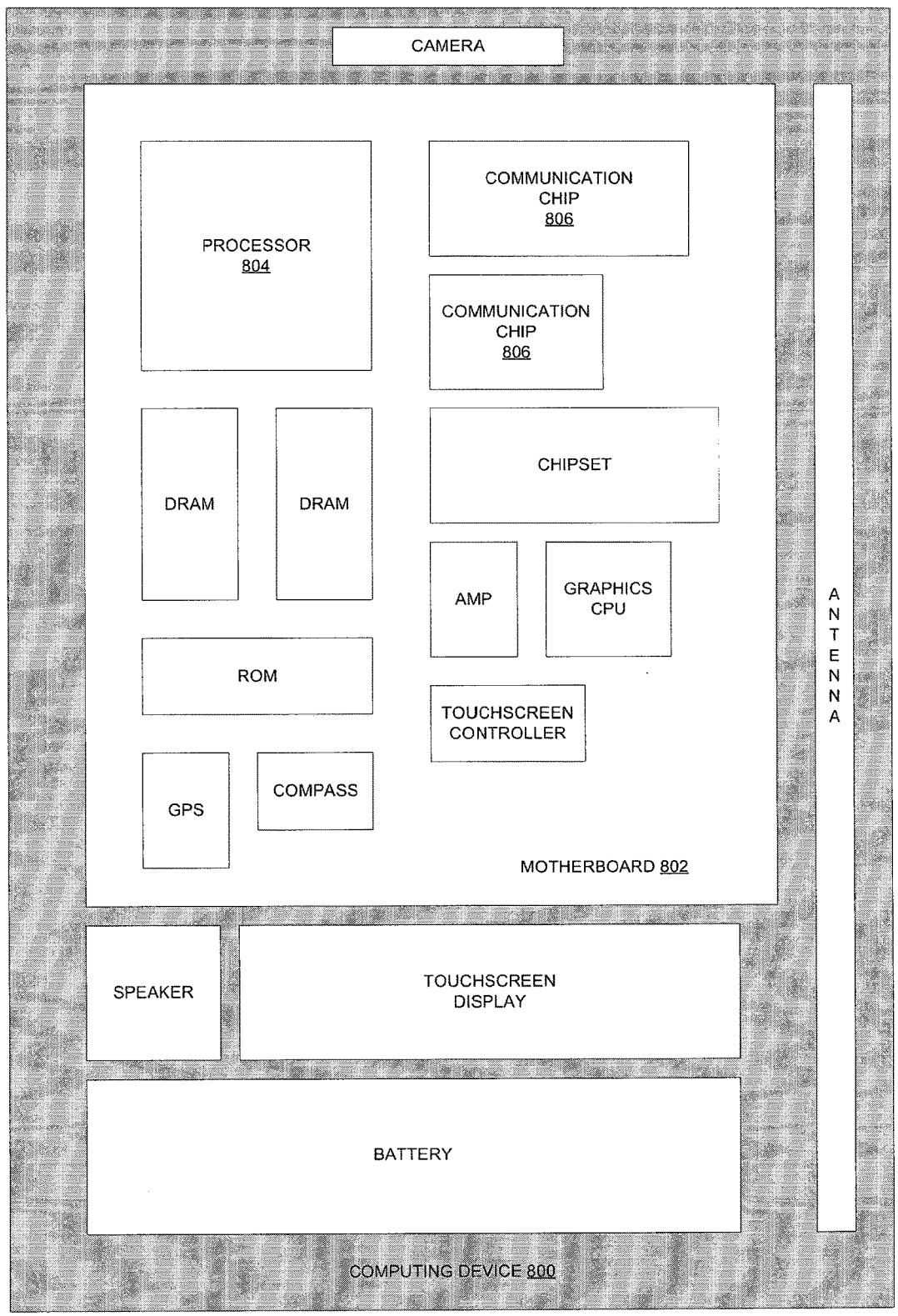
FIG. 8 illustrates a computing device in accordance with one embodiment of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes two or more fin-based transistors in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes two or more fin-based transistors in accordance with implementations of the invention.

In further implementations, another component housed within the computing device 800 may contain an integrated circuit die that includes two or more fin-based transistors in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

What is claimed is:

1. An apparatus, comprising:
   a first transistor, comprising:
   a first semiconductor fin with a top, a first sidewall, and a second sidewall opposite the first sidewall;
   a first gate dielectric structure that wraps around at least a portion of the first sidewall, at least a portion of the second sidewall, and at least a portion of the top of the first semiconductor fin and is in contact with the first semiconductor fin, the first gate dielectric structure comprising a first layer of a first dielectric material having a first thickness and being in contact with the top, the first sidewall and the second sidewall of the first semiconductor fin, and the first gate dielectric structure comprising a second layer of a second dielectric material on a portion of the first layer of the first dielectric material in contact with the top, the first sidewall and the second sidewall of the first semiconductor fin;

a first gate electrode structure that wraps around at least a portion of the first sidewall, at least a portion of the second sidewall, and at least a portion of the top of the first semiconductor fin, wherein at least a portion of the first gate dielectric structure is between at least a portion of the first semiconductor fin and the at least a portion of the first gate electrode structure; and a first n type source region to a first side of the first gate electrode structure; and a first n type drain region to a second side of the first gate electrode structure, the second side of the first gate electrode structure being opposite the first side of the first gate electrode structure; and a second transistor isolated from the first transistor, the second transistor comprising:

a second semiconductor fin with a top, a first sidewall, and a second sidewall opposite the first sidewall;

a second gate dielectric structure that wraps around at least a portion of the first sidewall, at least a portion of the second sidewall, and at least a portion of the top of the second semiconductor fin and is in contact with the second semiconductor fin, the second gate dielectric structure comprising a first layer, the first layer of the second gate dielectric structure comprising the first dielectric material and having a second thickness greater than the first thickness of the first layer of the first gate dielectric structure, and the first layer of the second gate dielectric structure in contact with the top, the first sidewall and the second sidewall of the second semiconductor fin, and the second gate dielectric structure comprising a second layer, the second layer of the second gate dielectric structure comprising the second dielectric material on a portion of the first layer of the second gate dielectric structure in contact with the top, the first sidewall and the second sidewall of the second semiconductor fin;

a second gate electrode structure that wraps around at least a portion of the first sidewall, at least a portion of the second sidewall, and at least a portion of the top of the second semiconductor fin, wherein at least a portion of the second gate dielectric structure is between at least a portion of the second semiconductor fin and the at least a portion of the second gate electrode structure;

a second n type source region to a first side of the second gate electrode structure; and a second n type drain region to a second side of the second gate electrode structure, the second side of the second gate electrode structure being opposite the first side of the second gate electrode structure.

2. The apparatus of claim 1, wherein the first dielectric material comprises silicon and oxygen.

3. The apparatus of claim 2, wherein the second dielectric material comprises hafnium and oxygen.

4. The apparatus of claim 2, wherein the second dielectric material comprises a high k value dielectric material.

5. The apparatus of claim 1, wherein the first dielectric material has a first k value and the second dielectric material has a second k value higher than the first k value.

6. The apparatus of claim 1, wherein the first gate electrode structure comprises a first electrode layer comprising titanium and nitrogen and having a third thickness, a second electrode layer comprising aluminum and being further from the first semiconductor fin than the first electrode layer, and a third electrode layer comprising titanium and being further from the first semiconductor fin than the second electrode layer.

* * * * *